(12) United States Patent
Lung

(10) Patent No.: US 7,642,539 B2
(45) Date of Patent: Jan. 5, 2010

(54) THIN FILM FUSE PHASE CHANGE CELL WITH THERMAL ISOLATION PAD AND MANUFACTURING METHOD

(75) Inventor: Hsiang Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 377 days.

(21) Appl. No.: 11/425,183

(22) Filed: Jun. 20, 2006

(65) Prior Publication Data

US 2007/0131922 A1 Jun. 14, 2007

Related U.S. Application Data

(60) Provisional application No. 60/749,843, filed on Dec. 13, 2005.

(51) Int. Cl.
*H01L 29/02* (2006.01)
*H01L 47/00* (2006.01)
(52) U.S. Cl. ............ 257/2; 257/3; 257/5; 257/E27.004; 257/E45.002; 438/95; 365/148
(58) Field of Classification Search ............... 257/2, 257/4, E45.002, E27.004; 365/148; 438/95
See application file for complete search history.

(56) References Cited

U.S. PATENT DOCUMENTS

| | | | |
|---|---|---|---|
| 3,271,591 | A | 9/1966 | Ovshinsky |
| 3,530,441 | A | 9/1970 | Ovshinsky |
| 4,599,705 | A | 7/1986 | Holmberg et al. |
| 4,719,594 | A | 1/1988 | Young et al. |
| 4,876,220 | A | 10/1989 | Mohsen et al. |
| 5,166,096 | A | 11/1992 | Cote et al. |

(Continued)

FOREIGN PATENT DOCUMENTS

| | | |
|---|---|---|
| WO | WO 00/45108 A1 | 8/2000 |
| WO | WO 00/79539 A1 | 12/2000 |
| WO | WO 01/45108 A1 | 6/2001 |

(Continued)

OTHER PUBLICATIONS

Adler, David, "Amorphous-Semiconductor Devices," Sci. Amer., vol. 236, pp. 36-48, May 1977.

(Continued)

*Primary Examiner*—Hsien-ming Lee
(74) *Attorney, Agent, or Firm*—Haynes Beffel & Wolfeld LLP

(57) ABSTRACT

A memory device comprising a first electrode having a top side, a second electrode having a top side and an insulating member between the first electrode and the second electrode. The insulating member has a thickness between the first and second electrodes near the top side of the first electrode and the top side of the second electrode extends outwardly from the top sides of the first and second electrodes defining a wall of insulating material having top side. A bridge of memory material crosses the insulating member over the top of the wall, and defines an inter-electrode path between the first and second electrodes across the insulating member. An array of such memory cells is provided. The bridge comprises an active layer of memory material on the top side of the wall, having at least two solid phases and a layer of thermal insulating material overlying the memory material having thermal conductivity less than a thermal conductivity of the first and second electrodes.

14 Claims, 18 Drawing Sheets

U.S. PATENT DOCUMENTS

| | | | |
|---|---|---|---|
| 5,166,758 A | 11/1992 | Ovshinsky et al. |
| 5,177,567 A | 1/1993 | Klersy et al. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,729 A | 6/2000 | Harshfield |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,563 B2 | 10/2004 | Xu |
| 6,815,704 B1 | 11/2004 | Chen |
| 6,861,267 B2 | 3/2005 | Xu et al. |
| 6,864,500 B2 | 3/2005 | Gilton |
| 6,864,603 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,229,883 B2 * | 6/2007 | Wang et al. ................. 438/266 |
| 2004/0248339 A1 | 12/2004 | Lung |
| 2005/0215009 A1 | 9/2005 | Cho |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM , Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel µTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp, 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek at al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21$_{13}$ Tyson__P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

US 7,642,539 B2

THIN FILM FUSE PHASE CHANGE CELL WITH THERMAL ISOLATION PAD AND MANUFACTURING METHOD

PRIORITY CLAIM

This application claims the benefit of U.S. Provisional Application No. 60/749,843, entitled THIN FILM FUSE PHASE CHANGE CELL WITH THERMAL ISOLATION PAD AND MANUFACTURING METHOD, filed on 13 Dec. 2005.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in the process that meet tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure which are compatible with manufacturing of peripheral circuits on the same integrated circuit.

SUMMARY OF THE INVENTION

A phase change random access memory PCRAM device is described suitable for use in large-scale integrated circuits. Technology described herein includes a memory device comprising a first electrode having a top side, a second electrode having a top side and an insulating member between the first electrode and the second electrode. The insulating member extends above the top surfaces of the first and second electrodes to form a wall of insulating material. The bridge of memory material comprises three components in illustrated example, including a first thermally insulating pad on the surface of the first electrode, a second thermally insulating pad on the surface of the second electrode, and a narrow strip of memory material extending across the wall of insulating material. The insulating member has a thickness between the first and second electrodes near the top side of the first electrode and the top side of the second electrode. The thin film bridge crosses the insulating member, and defines an inter-electrode path between the first and second electrodes across the insulating member. The inter-electrode path across the insulating member has a path length defined by the width of the insulating member. For the purpose of illustration, the bridge can be thought of as having a structure like a fuse. For the phase change memory however, and unlike a fuse, the bridge comprises memory material having at least two solid phases that are reversible, such as a chalcogenide-based material or other related material, by applying a current through the material or applying a voltage across the first and second electrodes.

The volume of memory material subject to phase change can be very small, determined by the thickness of the insulating member (path length in the x-direction), the thickness of the thin film on top of the insulating member used to form the bridge (y-direction), and the width of the bridge orthogonal to the path length (z-direction). The thickness of the insulating member and the thickness of the thin film of memory material used to form the bridge are determined in embodiments of the technology by thin film thicknesses which are not limited by the lithographic processes used in manufacturing the memory cell. The width of the bridge is also smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the more narrow pattern onto the layer of memory material. Also, other techniques can be used to form narrow lines of material in a layer on an integrated circuit. Accordingly, a phase change memory cell with simple structure achieves very small reset current and low power consumption, and is easily manufactured.

A method for manufacturing a memory device is also described. The method comprises forming an electrode layer on a substrate which comprises circuitry made using front-end-of-line procedures. The electrode layer in this method has a top surface. The electrode layer includes a first electrode and a second electrode, and an insulating member between the first and second electrodes for each phase change memory cell to be formed. The first and second electrodes and the insulating member extend to the top surface of the electrode layer. The material of the first and second electrodes is etched back to form a wall on insulating material extending above the surface of the electrodes. The method also includes forming a bridge of memory material on the top surface of the electrode layer across the wall of insulating material in the insulating member for each memory cell to be formed. The bridge comprises a film of memory material having a first side and a second side and contacts the first and second electrodes on the first side. The bridge defines an inter-electrode path between the first and second electrodes across the insulating member having a path length defined by the width of the insulating member. In embodiments of the method, an access structure over the electrode layer is made by forming a patterned conductive layer over said bridge, and forming a contact between said first electrode and said patterned conductive layer.

In an embodiment of the manufacturing method, the electrode layer is made by a process comprising a number of steps including the following:

forming a dielectric layer on a substrate;

forming a first conductive layer on the dielectric layer;

etching a pattern in the first conductive layer, the pattern including regions between the stacks exposing the substrate, and stacks on the substrate including remaining portions of the dielectric layer and remaining portions of the first conductive layer, the stacks having sidewalls;

forming a sidewall dielectric layer over the stacks and etching the sidewall dielectric layer to form sidewall spacers on the sidewalls of the stacks;

forming a second conductive layer over the regions between the stacks, the sidewall spacers and the stacks; and polishing the second conductive layer, by chemical mechanical polishing or otherwise, to define the electrode layer, wherein the sidewall spacers are exposed on the top surface; and selectively etching back the material of the first and second electrodes to expose a wall of insulating material of the sidewall spacers, wherein the sidewall spacers and walls of insulating material act as the insulating member, portions of the first conductive layer in the stacks are exposed on the etched back top surface and act as the first electrode, and portions of the second conductive layer in the regions between the stacks are exposed on the etched back top surface and act as the second electrode.

In an embodiment of the manufacturing method, the bridges of memory material are made by a process comprising a number of steps including the following:

forming a layer of memory material on the top surface of the electrode layer;

forming a layer of resist material over the layer of memory material;

patterning the layer of resist material using a lithographic process to define a stripe;

trimming the width of the stripe to define a more narrow stripe of resist material over the layer of memory material;

etching the layer of memory material which is not protected by the more narrow stripe of resist material to form a stripe of memory material; and patterning the stripe of memory material to define said bridge.

The method described herein for formation of the bridge, for use in a memory cell in the PCRAM, can be used to make a very small bridge for other uses. Nano-technology devices with very small bridge structures are provided using materials other than phase change materials, like metals, dielectrics, organic materials, semiconductors, and so on.

Other aspects and advantages of the technology described herein are set forth below.

DETAILED DESCRIPTION

A detailed description of thin film fuse phase change memory cells, arrays of such memory cells, and methods for manufacturing such memory cells, is provided with reference to FIGS. 1-22.

Figure 1:
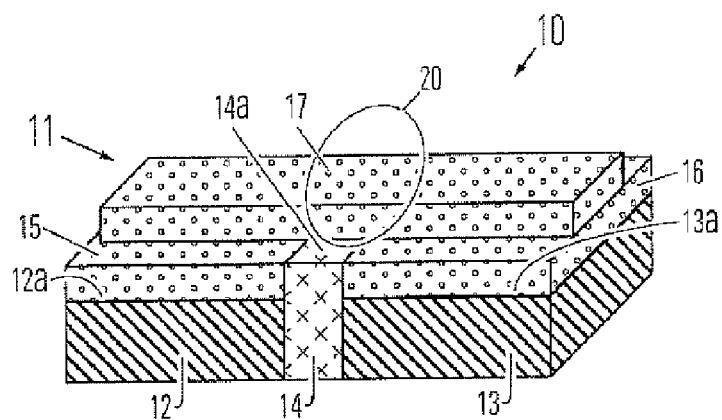
FIG. 1 illustrates an embodiment of a thin film bridge phase change memory element.

FIG. 1 illustrates a basic structure of a memory cell 10 including a bridge 11 of memory material on an electrode layer which comprises a first electrode 12, a second electrode 13, and an insulating member 14 between the first electrode 12 and the second electrode 13. As illustrated, the first and second electrodes 12, 13 comprise one or more layers of metal such as tungsten, copper, TiN, TaN or other metallic materials, and have top surfaces 12a and 13a. The insulating member 14 extends above the top surfaces 12a and 13a of the first and second electrodes 12, 13 to form a wall of insulating material which has a top surface 14a. The bridge 11 of memory material comprises three components in illustrated example, including a first thermally insulating pad 15 on the surface 12a of the first electrode, a second thermally insulating pad 16 on the surface 13a of the second electrode, and a narrow strip 17. In the embodiment illustrated, the first and second thermally insulating pads 15, 16 have top surfaces which are coplanar with the top surface 14a of the wall of insulating material, defining a planar top surface. The narrow strip 17 of memory material lies on the planar top surface. Contacts between the first electrode and the bridge 11 and between the second electrode 13 and the bridge 11 are made on the bottom side of the bridge 11 on the thermally insulating pads 15, 16. The active region 20 of the memory material lies near the top surface 14a of the insulating wall in the narrow strip 17. As can be appreciated, the active region 20 can be made extremely small in the illustrated structure, reducing the magnitude of current needed to induce the phase changes.

In the embodiment illustrated in FIG. 1, the first and second insulating pads 15, 16 comprise the same material as the narrow strip of memory material 17. This configuration is useful when the memory material has a thermal conductivity which is lower than that of the electrode material. For example, if the memory material comprises a phase change material like GST described below, and the electrode material comprises TiN, then the active region 20 in the narrow strip 17 of memory material will be thermally isolated from the electrode material by the pads 15, 16, to the extent that the thermal conductivity is low in the memory material. In other embodiments, the thermally insulating pads 15, 16 may comprise materials that are different from the memory material, and yet provide for electrical communication between the narrow strip 17 of memory material and the electrodes 12, 13. For example, in alternative embodiments, the thermally insulating pads may comprise a doped GST in which the doping material causes an even lower thermal conductivity. The thermally insulating pads may comprise a variety of other memory materials, as described in more detail below. Alternatively, the thermally insulating pads may comprise metal oxides, such as tin oxides $SnO_x$, indium oxides $InO_x$ or titanium oxides $TiO_x$, so long as the material provides electrical communication between the bridge of memory material and the electrode materials, while providing thermal insulation better than the thermal insulation of the metal electrodes.

Figure 2:
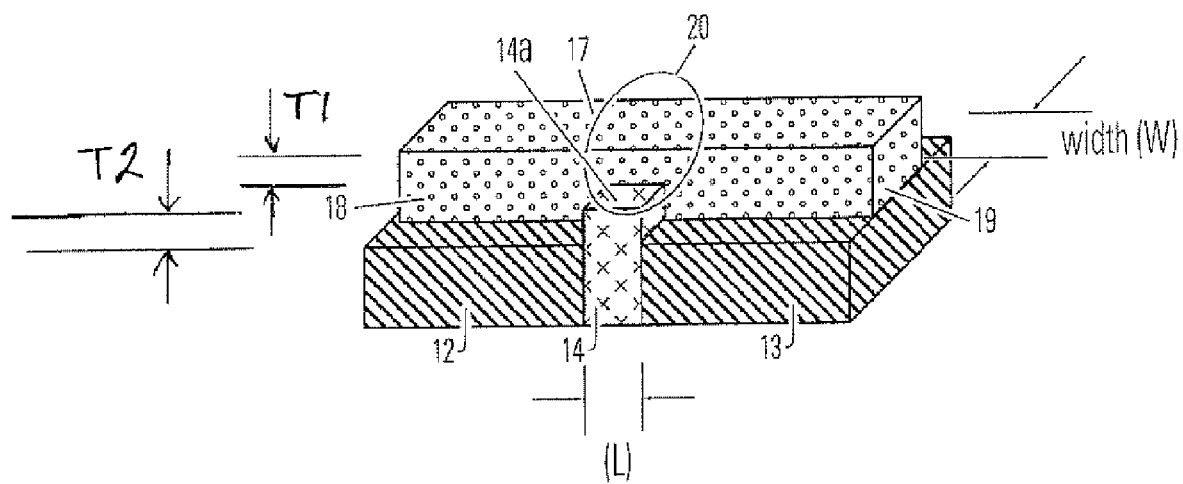
FIG. 2 illustrates an alternative embodiment of a thin film bridge phase change memory element.

FIG. 2 shows an alternative implementation of a basic structure of a memory cell 10, using like reference numerals for like components. In the embodiment shown in FIG. 2, the thermally insulating pads comprise narrow structures 18, 19, rather than the broader structures forming pads 15, 16 shown in FIG. 1. In the embodiment shown in FIG. 2, the process of etching the narrow strip 17 of memory material can be applied to also define the extent of the thermally insulating pads.

Access circuitry can be implemented to contact the first electrode 12 and the second electrode 13 in a variety of configurations for controlling the operation of the memory cell, so that it can be programmed to set the bridge 11 in one of the two solid phases that can be reversibly implemented using the memory material. For example, using a chalcogenide-based phase change memory material, the memory cell may be set to a relatively high resistivity state in which at least a portion of the bridge in the current path is in an amorphous state, and a relatively low resistivity state in which most of the bridge in the current path is in a crystalline state.

FIG. 2 illustrates important dimensions of the memory cell 10. The length L (x-dimension) of the active region 20 is defined by the thickness of the insulating member 14, between the first electrode 12 and the second electrode 13. This length L can be controlled by controlling the width of the insulating member 14 at surface 14a in embodiments of the memory cell. In representative embodiments, the width of the insulating member 14 can be established using a thin film deposition technique to form a thin sidewall dielectric on the side of an electrode stack. Thus, embodiments of the memory cell have a channel length L less than 100 nm. Other embodiments have a channel length L of about 40 nm or less. In yet other embodiments, the channel length is less than 20 nm. It will be understood that the channel length L can be even smaller than 20 nm, using thin-film deposition techniques such as atomic layer deposition and the like, according to the needs of the particular application. The wall of insulating material may extend upward from the surfaces of the electrodes 12, 13 by a range of about 50 to 100 nanometers, for example, in some embodiments of the memory cell, which in turn determines the thicknesses of the insulating pads.

Likewise, the bridge thickness T1 (y-dimension) can be very small in embodiments of the memory cell. This bridge thickness T1 can be established using a thin film deposition technique on the top surfaces of the first electrode 12 or thermally insulating pad 18, top 14a of the insulating wall on insulating member 14, and second electrode 13 or thermally insulating pad 19. Thus, embodiments of the memory cell have a bridge thickness T1 about 50 nm or less. Other embodiments of the memory cell have a bridge thickness of about 20 nm or less. In yet other embodiments, the bridge thickness T1 is about 10 nm or less. It will be understood that the bridge thickness T1 can be even smaller than 10 nm, using thin film deposition techniques such as atomic layer deposition and the like, according to the needs of the particular application, so long as the thickness is sufficient for the bridge to perform its purpose as memory element. Thickness T1 of the layer 17 of phase change material over the top surface 14a of the insulating wall 14 can be different than the thickness T2 of the pads, which corresponds in FIG. 2 with the distance that the insulating wall 14 extends above the electrodes 12 and 13. In some embodiments, the thickness T2 is greater than the thickness T1, including for example 2 to 5 times greater.

As illustrated in FIG. 2, the bridge width W (z-dimension) is likewise very small. This bridge width W is implemented in preferred embodiments, so that it has a width less than 100 nm. In some embodiments, the bridge width W is about 40 nm or less.

Embodiments of the memory cell include phase change based memory materials, including chalcogenide based materials and other materials, for the bridge 11. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", *SPIE* v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $PrSrMnO_3$, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory materials useful in alternative embodiments. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x:y=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an anneal time of less than 2 hours.

The thickness of CMR material depends on the design of the cell structure. The CMR thickness of 10 nm to 200 nm can be used for the core material. A buffer layer of YBCO ($YBaCuO_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually done at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually done at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an anneal time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minute to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is done at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an anneal time of less than 1 hour.

Another technique for forming a layer of polymer-based memory material is to use a spin-coater with doped-TCNQ solution at a rotation of less than 1000 rpm. After spin-coating, the wafer is held (typically at room temperature or temperature less than 200° C.) for a time sufficient for solid-state formation. The hold time ranges from several minutes to days, depending on the temperature and on the formation conditions.

Figure 3:
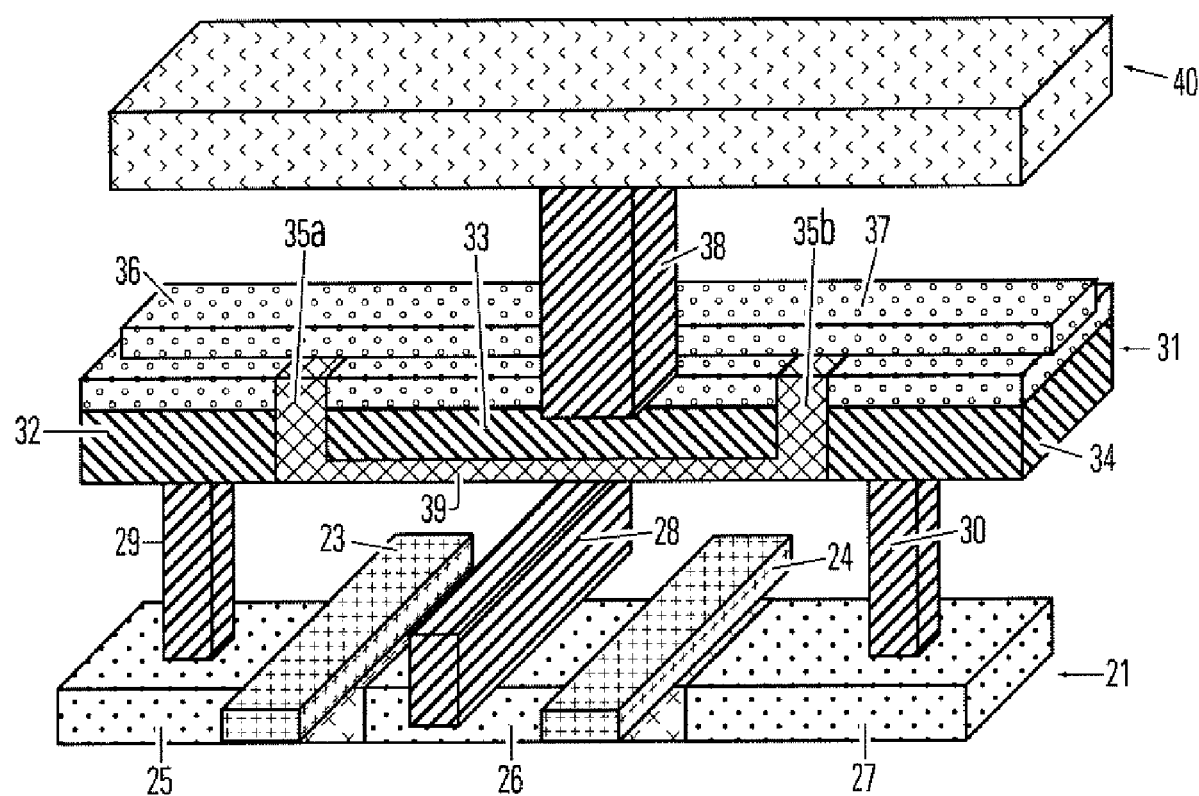
FIG. 3 illustrates a structure for a pair of phase change memory elements with access circuitry below an electrode layer and bit lines above the electrode layer.

FIG. 3 depicts a structure for PCRAM cells such as cells described with reference to FIGS. 1 and 2. The cells are formed on a semiconductor substrate 21. Isolation structures such as shallow trench isolation STI dielectrics (not shown) isolate pairs of rows of memory cell access transistors. The access transistors are formed by n-type terminal 26 acting as a common source region and n-type terminals 25 and 27 acting as drain regions in a p-type substrate 21. Polysilicon word lines 23 and 24 form the gates of the access transistors. A dielectric fill layer (not illustrated) is formed over the polysilicon word lines. The layer is patterned and conductive structures, including common source line 28 and plug structures 29 and 30 are formed. The conductive material can be tungsten or other materials and combinations suitable for the plug and lines structures. The common source line 28 contacts the source terminal 26, and acts as a common source line along a row in the array. The plug structures 29 and 30 contact the drain terminals 25 and 27, respectively. The fill layer (not shown), the common source line 28 and the plug structures 29 and 30, have a generally planar top surface, suitable for formation of an electrode layer 31.

The electrode layer 31 includes electrode members 32, 33 and 34, which are separated from one another by an insulating member including insulating walls 35a and 35b formed for example by a sidewall process as described below, and base member 39. The base member 39 can be thicker than the fences 35a, 35b in embodiments of the structure, and separates the electrode member 33 from the common source line 28. For example the base member can be for instance, 80 to 140 nm thick while the fences are much narrower, as needed to reduce capacitive coupling between the source line 28 and the electrode member 33. The fences 35a, 35b comprise a thin film dielectric material on the sidewalls of electrode members 32, 34 in the illustrated embodiment, with a thickness at the surface of the electrode layer 31 determined by the thin film thickness on the sidewalls.

A thin film bridge 36 of memory material, such as GST, overlies the electrode layer 31 on one side traversing across the top of insulating wall 35a, forming a first memory cell, and a thin film bridge 37 of memory material, such as GST, overlies the electrode layer 31 on another side traversing across the top of insulating wall 35b, forming a second memory cell. As described above with respect to FIG. 1, the bridges 36 and 37 include thermally insulating pads in contact with electrode members 32, 33, 34, and respective narrow strips overlying the pads and the insulating walls.

A dielectric fill layer (not illustrated) overlies the thin film bridges 36, 37. The dielectric fill layer comprises silicon dioxide, a polyimide, silicon nitride or other dielectric fill materials. In embodiments, the fill layer comprises a relatively good insulator for heat as well as for electricity, providing thermal and electrical isolation for the bridges. Tungsten plug 38 contacts the electrode member 33. A patterned conductive layer 40, comprising metal or other conductive material, including bit lines in an array structure, overlies the dielectric fill layer, and contacts the plug 38 to establish access to the memory cells corresponding to the thin film bridge 36 and the thin film bridge 37.

Figure 4:
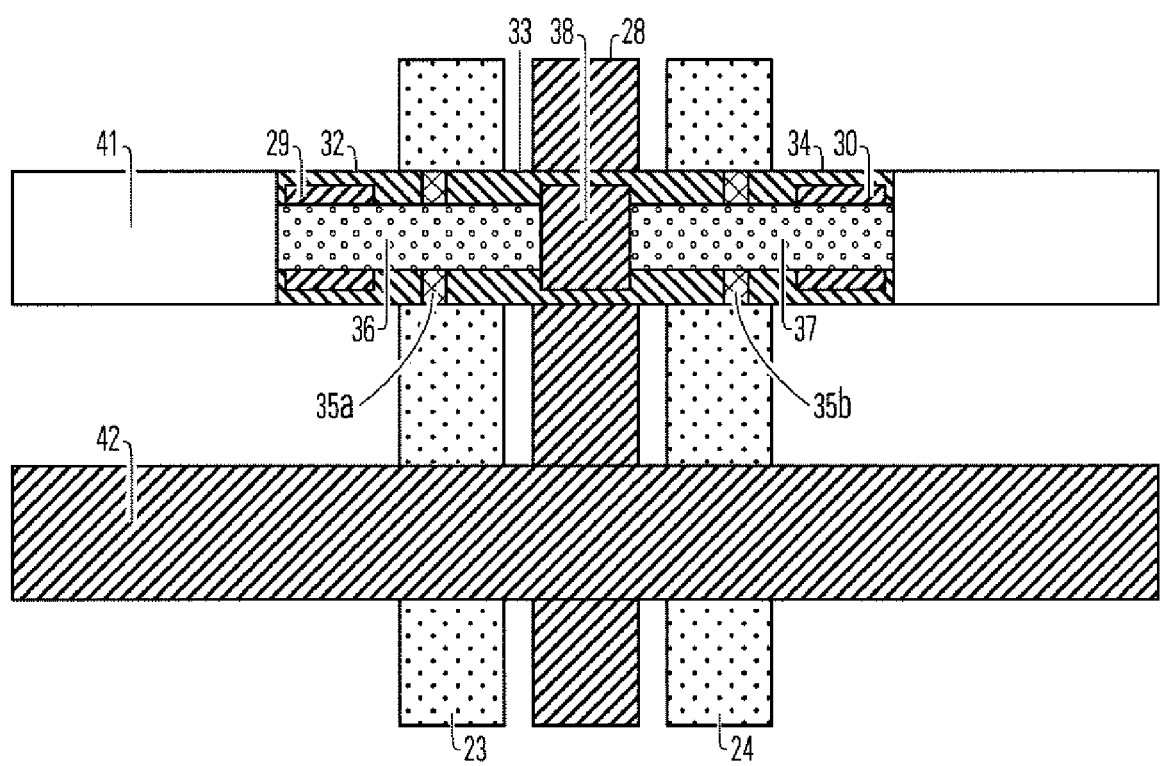
FIG. 4 shows a layout or plan view for the structure illustrated in FIG. 3.

FIG. 4 shows the structure above the semiconductor substrate layer 21 of FIG. 3 in layout view. Thus, the word lines 23 and 24 are laid out substantially parallel to the common source line 28, along those in an array of memory cells. Plugs 29 and 30 contact terminals of access transistors in the semiconductor substrate and the underside of electrode members 32 and 34 respectively. Thin film bridges 36 and 37 of memory material overlie the electrode members 32, 33 and 34, and the insulating fences 35a, 35b separate the electrode members. Thermally insulating pads between the narrow strips of memory material and the contacts are not shown in FIG. 4 to simplify the layout drawing, but are included as discussed above. Plug 38 contacts the electrode member 33 between the bridges 36 and 37 and the underside of a metal bit line 41 (transparent in FIG. 4) in the patterned conductive layer 40. Metal bit line 42 (not transparent) is also illustrated in FIG. 4 to emphasize the array layout of the structure.

In operation, access to the memory cell corresponding with bridge 36 is accomplished by applying a control signal to the word line 23, which couples the common source line 28 via terminal 25, plug 29, and electrode member 32 to the thin-film bridge 36. Electrode member 33 is coupled via the contact plug 38 to a bit line in the patterned conductive layer 40. Likewise, access to the memory cell corresponding with bridge 37 is accomplished by applying a control signal to the word line 24.

It will be understood that a wide variety of materials can be utilized in implementation of the structure illustrated in FIGS. 3 and 4. For example, copper metallization can be used. Other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the electrodes may be TiAlN or TaAlN, or may comprise, for further examples, one or more elements selected from the group consisting of Ti, W, Mo, Al, Ta, Cu, Pt, Ir, La, Ni, and Ru and alloys thereof. The inter-electrode fence members 35a, 35b may be silicon oxide, silicon oxynitride, silicon nitride, $Al_2O_3$, or other low K dielectrics. Alternatively, the inter-electrode insulating layer may comprise one or more elements selected from the group consisting of Si, Al, F, N, O, and C.

Figure 5:
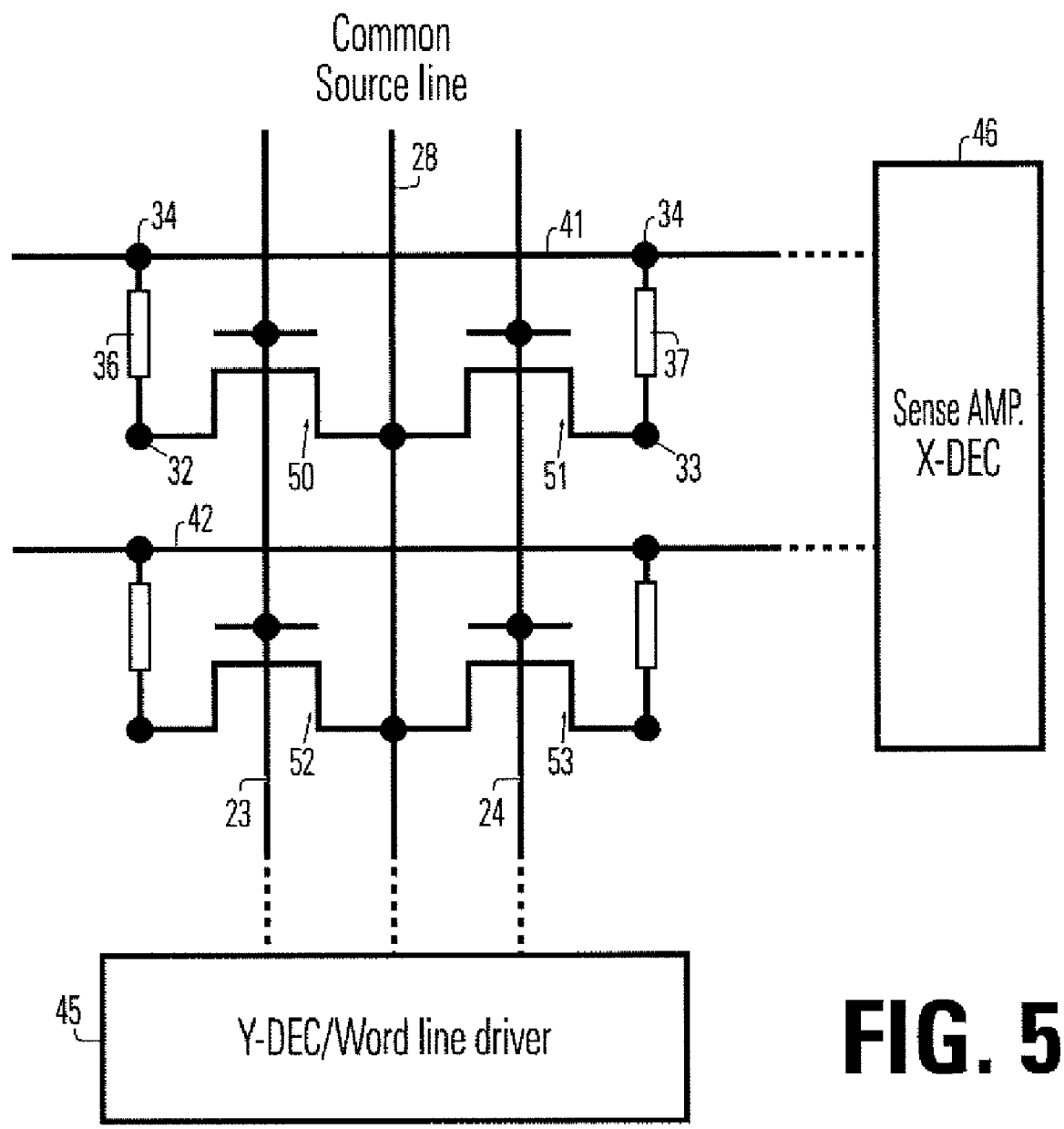
FIG. 5 is a schematic diagram for a memory array comprising phase change memory elements.

FIG. 5 is a schematic illustration of a memory array, which can be implemented as described with reference to FIGS. 3 and 4. Thus, reference numerals for elements of FIG. 5 match corresponding elements in the structure of FIGS. 3 and 4. It will be understood that the array structure illustrated in FIG. 5 can be implemented using other cell structures. In a schematic illustration of FIG. 5, the common source line 28, the word line 23 and the word line 24 are arranged generally parallel in the Y-direction. Bit lines 41 and 42 are arranged generally parallel in the X-direction. Thus, a Y-decoder and a word line driver in block 45 are coupled to the word lines 23, 24. An X-decoder and set of sense amplifiers in block 46 are coupled to the bit lines 41 and 42. The common source line 28 is coupled to the source terminals of access transistors 50, 51, 52 and 53. The gate of access transistor 50 is coupled to the word line 23. The gate of access transistor 51 is coupled to the word line 24. The gate of access transistor 52 is coupled to the word line 23. The gate of access transistor 53 is coupled to the word line 24. The drain of access transistor 50 is coupled to the electrode member 32 for bridge 36, which is in turn coupled to electrode member 34. Likewise, the drain of access transistor 51 is coupled to the electrode member 33 for bridge 37, which is in turn coupled to the electrode member 34. The electrode member 34 is coupled to the bit line 41. For schematic purposes, the electrode member 34 is illustrated at separate locations on the bit line 41. It will be appreciated that separate electrode members can be utilized for the separate memory cell bridges in other embodiments. Access transistors 52 and 53 are coupled to corresponding memory cells as well on line 42. It can be seen that the common source line 28 is shared by two rows of memory cells, where a row is arranged in the Y-direction in the illustrated schematic. Likewise, the electrode member 34 is shared by two memory cells in a column in the array, where a column is arranged in the X-direction in the illustrated schematic.

Figure 6:
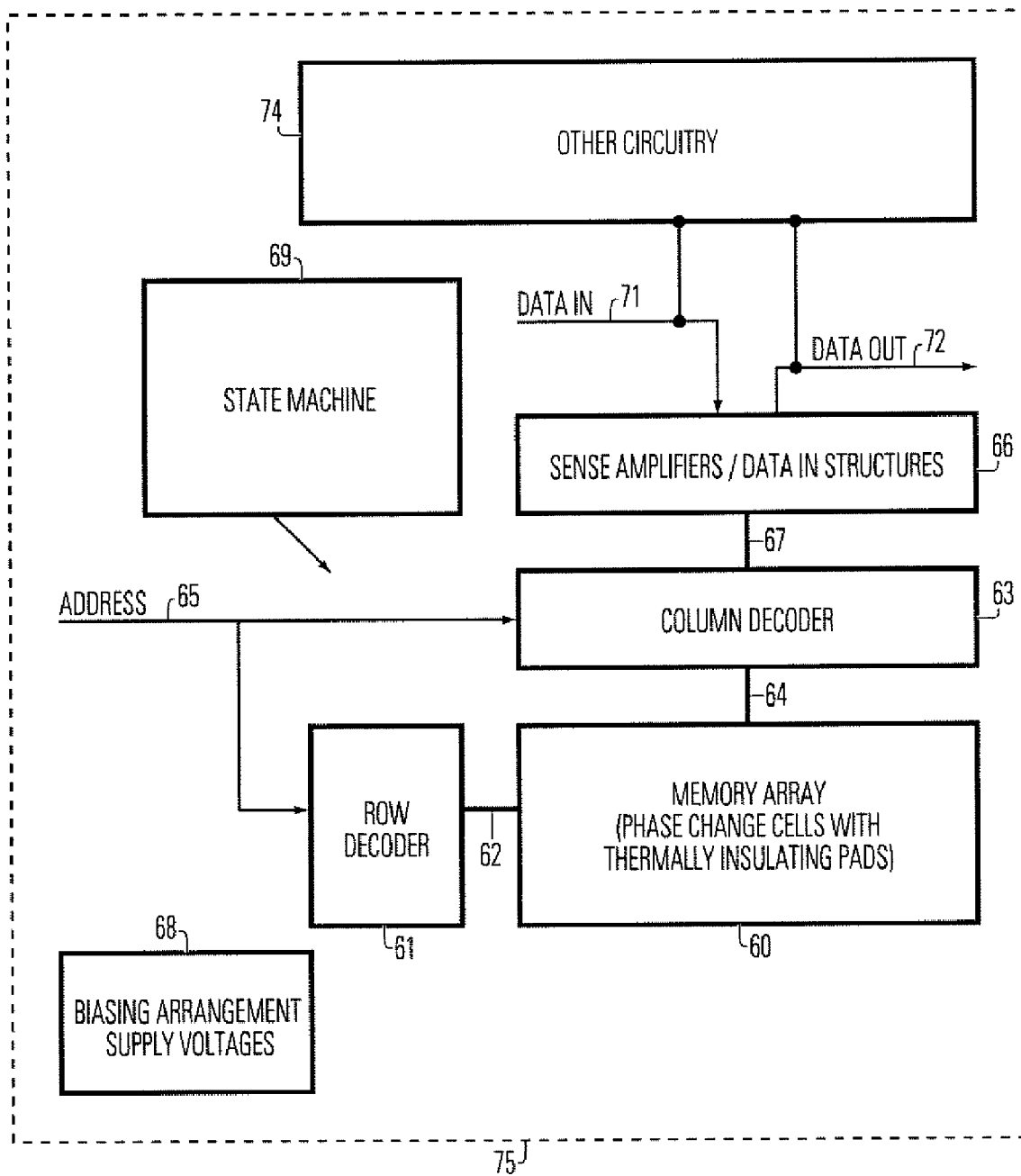
FIG. 6 is a block diagram of an integrated circuit device including a thin film fuse phase change memory array and other circuitry.

FIG. 6 is a simplified block diagram of an integrated circuit according to an embodiment of the present invention. The integrated circuit 75 includes a memory array 60 implemented using thin film fuse phase change memory cells with thermally insulating pads, on a semiconductor substrate. A row decoder 61 is coupled to a plurality of word lines 62, and arranged along rows in the memory array 60. A column decoder 63 is coupled to a plurality of bit lines 64 arranged along columns in the memory array 60 for reading and programming data from the thin film phase change memory cells in the array 60. Addresses are supplied on bus 65 to column decoder 63 and row decoder 61. Sense amplifiers and data-in structures in block 66 are coupled to the column decoder 63 via data bus 67. Data is supplied via the data-in line 71 from input/output ports on the integrated circuit 75 or from other data sources internal or external to the integrated circuit 75, to the data-in structures in block 66. In the illustrated embodiment, other circuitry 74 is included on the integrated circuit, such as a general purpose processor or special purpose application circuitry, or a combination of modules providing system-on-a-chip functionality supported by the thin film fuse phase change memory cell array. Data is supplied via the data-out line 72 from the sense amplifiers in block 66 to input/output ports on the integrated circuit 75, or to other data destinations internal or external to the integrated circuit 75.

A controller implemented in this example using bias arrangement state machine 69 controls the application of bias arrangement supply voltages 68, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 7:
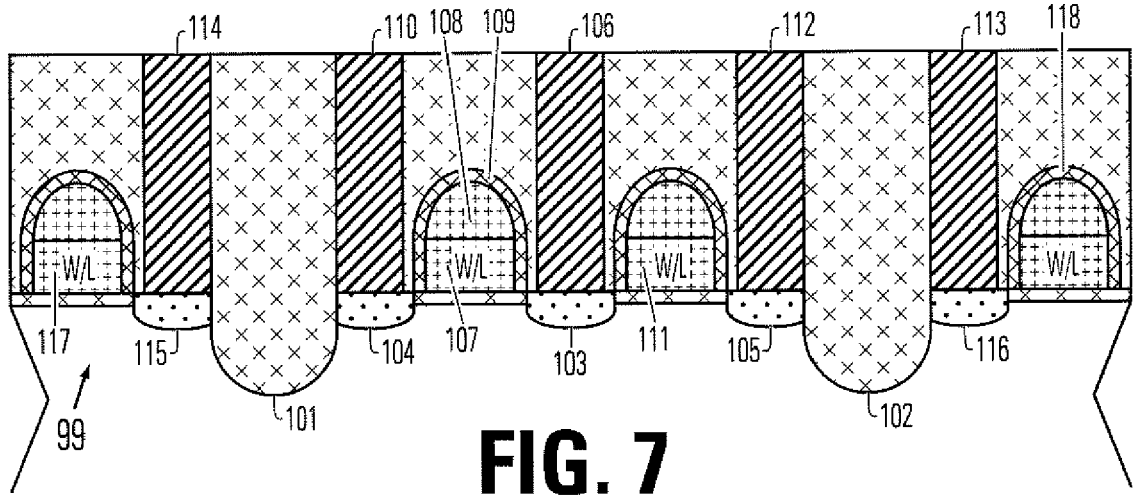
FIG. 7 is a cross-section of a substrate that includes access circuitry formed by front-end-of-line processes, made in a process for manufacturing a phase change memory device based on the structure shown in FIG. 3.

FIG. 7 illustrates a structure 99 after front-end-of-line processing, forming the standard CMOS components in the illustrated embodiment corresponding to the word lines, the source line, and the access transistors in the array shown in FIG. 7. In FIG. 7, source line 106 overlies doped region 103 in the semiconductor substrate, where the doped region 103 corresponds with the source terminal of a first access transistor on the left in the figure, and of a second access transistor on the right in the figure. In this embodiment, the source line 106 extends to the top surface of the structure 99. In other embodiments the source line does not extend all the way to the surface. Doped region 104 corresponds with the drain terminal of the first access transistor. A word line including polysilicon 107, and silicide cap 108, acts as the gate of the first access transistor. Dielectric layer 109 overlies the polysilicon 107 and silicide cap 108. Plug 110 contacts doped region 104, and provides a conductive path to the surface of the structure 99 for contact to a memory cell electrode as described below. The drain terminal of the second access transistor is provided by doped region 105. A word line including polysilicon line 111, and the silicide cap (not labeled) acts as the gate for the second access transistor. Plug 112 contacts doped region 105 and provides a conductive path to the top surface of the structure 99 for contact to a memory cell electrode as described below. Isolation trenches 101 and 102 separate the two-transistor structure coupled to the plugs 110 and 112, from adjacent two-transistor structures. On the left, doped region 115, word line polysilicon 117 and plug 114 are shown. On the right, doped region 116, word line polysilicon 118 and plug 113 are shown. The structure 99 illustrated in FIG. 7 provides a substrate for formation of memory cell components, including the first and second electrodes, and the bridge of memory material, as described in more detail below.

Figure 8:
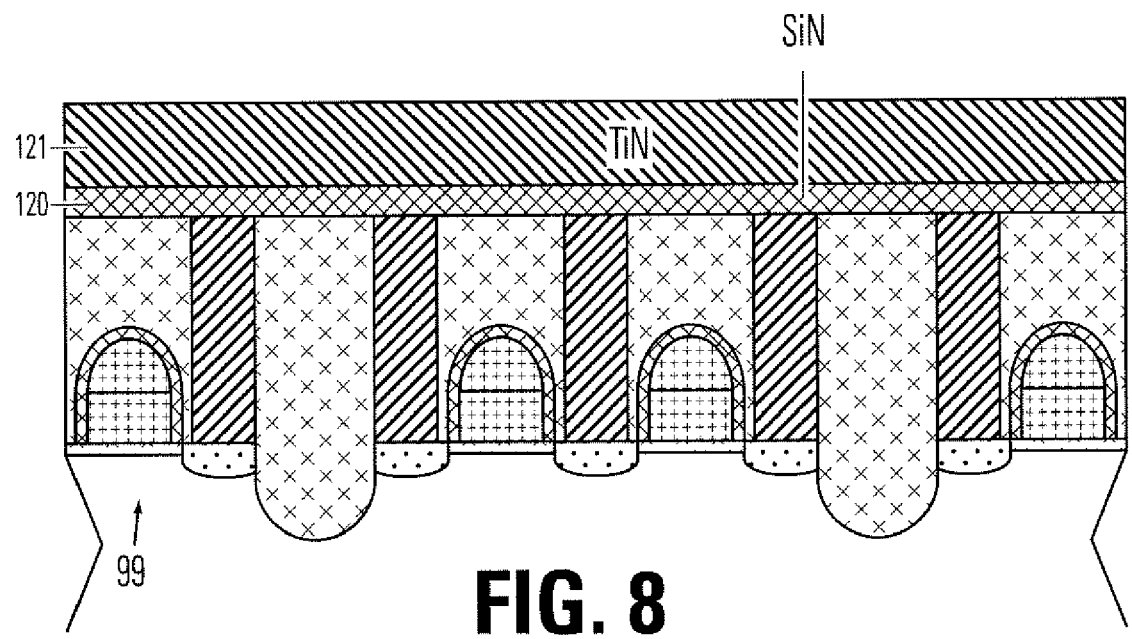
FIG. 8 is a cross-section showing initial steps in formation of an electrode layer for the structure shown in FIG. 3.

FIG. 8 illustrates a next stage in the process, in which a thin dielectric layer 120 comprising silicon nitride SiN or other dielectric material, such as silicon dioxide, silicon oxynitride, aluminum oxide, and the like, is formed on the surface of the structure 99. Then a layer 121 of conductive electrode material such as titanium nitride TiN, or other suitable conductive material, such as TaN, aluminum alloys, copper alloys, doped polysilicon, etc., is formed on the dielectric layer 120.

Figure 9A:
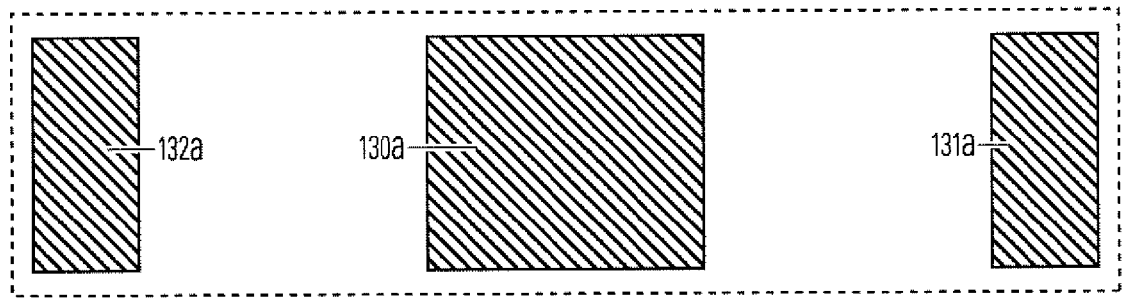
FIGS. 9A and 9B show layout and cross-sectional views for patterning the structure of FIG. 8, forming electrode stacks in the electrode layer for the structure shown in FIG. 3.
Figure 9B:
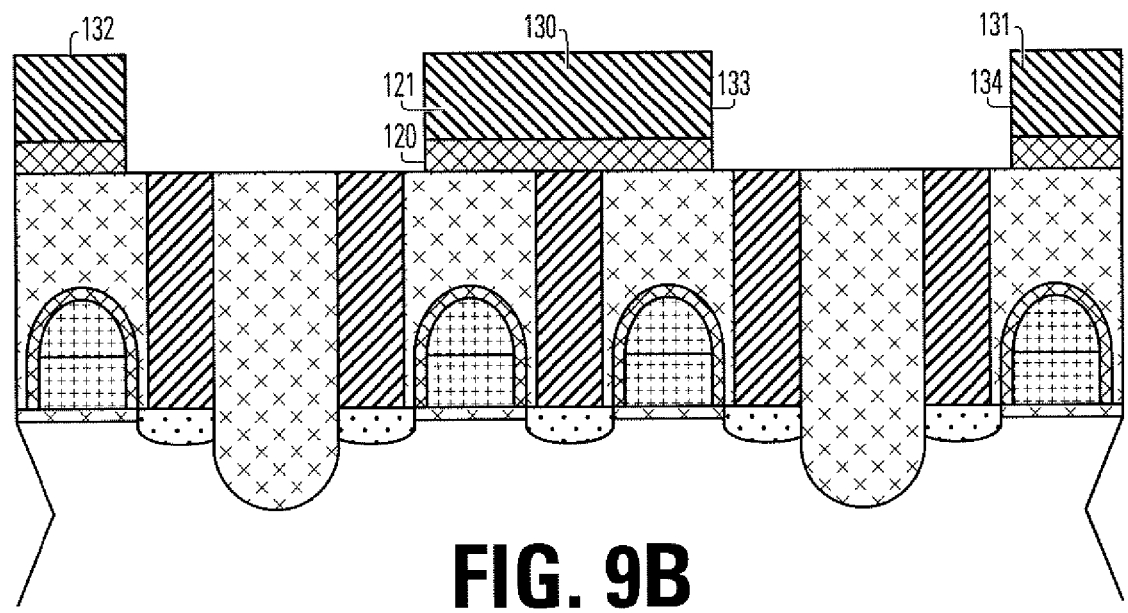

FIGS. 9A and 9B illustrate a next stage in the process, in which the conductive electrode layer 121 and the dielectric layer 120 are patterned to define electrode stacks 130, 131 and 132 on the surface of the structure 99 (130a, 131a, 132a in FIG. 9A. In an embodiment, the electrode stacks are defined by a mask lithographic step that produces a patterned layer of photoresist, followed by dimension measurement and verification steps known in the art, and then etching of the TiN and SiN used for formation of the layers 121 and 120. The stacks have sidewalls 133 and 134.

Figure 10:
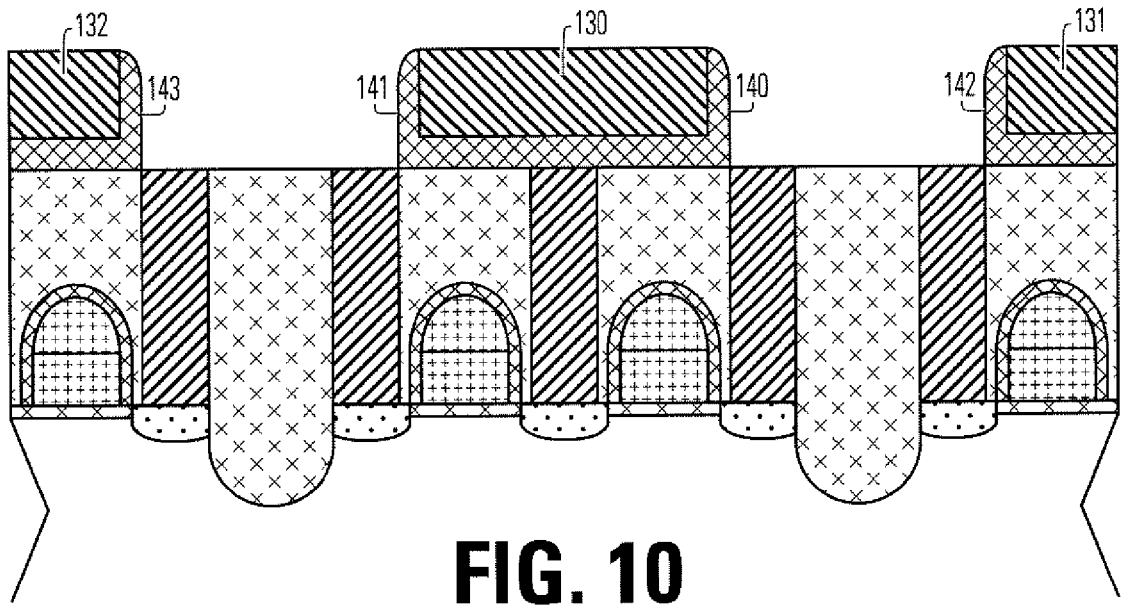
FIG. 10 shows a cross-sectional view corresponding to steps for formation of sidewall insulators on the electrode stacks of FIG. 9B.

FIG. 10 illustrates a next stage in the process, in which dielectric sidewalls 140, 141, 142 and 143 are formed on the sidewalls of the stacks 130, 131, 132, by forming a thin film dielectric layer (not shown) that is conformal with the stacks and the sidewalls of the stacks, and then anisotropically etching the thin film dielectric to remove it from the regions between the stacks and on the surfaces of the stacks, while remaining on the sidewalls. In embodiments of the process, the material used for formation of the sidewalls 140, 141, 142 and 143 comprises SiN or other dielectric material, such as silicon dioxide, silicon oxynitride, aluminum oxide, and the like.

Figure 11:
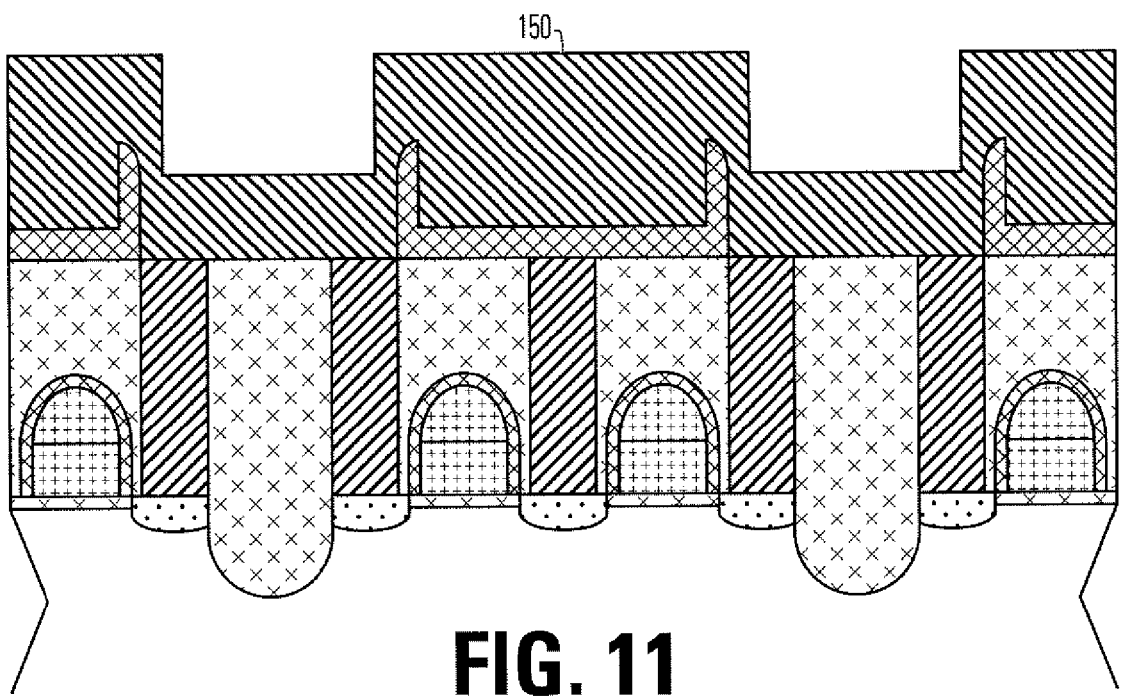
FIG. 11 shows a cross-sectional view corresponding to steps for formation of a layer of conductor material over the structure of FIG. 10.

FIG. 11 illustrates a next stage in the process, in which a second electrode material layer 150 is formed over the stacks 130, 131 132 and the sidewalls 140, 141, 142, 143. The electrode material layer 150 comprises TiN or other suitable conductive material, such as TaN, aluminum alloys, copper alloys, doped polysilicon, etc.

Figure 12:
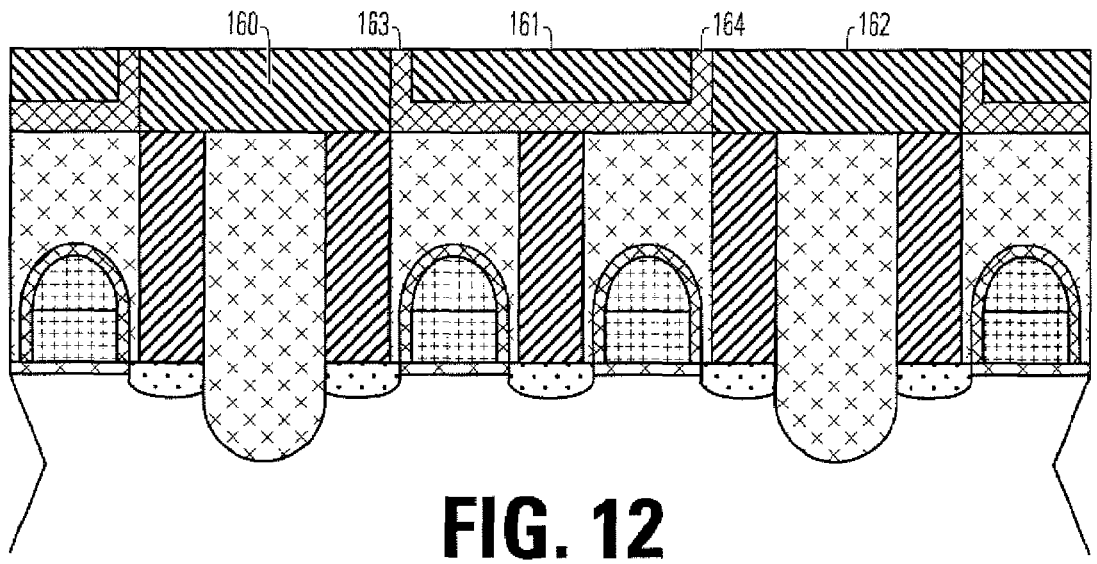
FIG. 12 shows a cross-sectional view corresponding to steps for polishing the conductive material and sidewall insulators in the structure of FIG. 11.

FIG. 12 illustrates a next stage in the process, in which the second electrode material layer 150, the sidewalls 140, 141, 142, 143 and the stacks 130, 131, 132 are etched and planarized to define an electrode layer over the substrate provided by structure 99. Embodiments of the process for polishing include a chemical mechanical polishing process, followed by brush clean and liquid and or gas clean procedures, as known in the art. The electrode layer includes electrode members 160, 161, 162, and insulating members 163 and 164 in between them. The electrode layer in the illustrated embodiment has a substantially planar top surface. In the embodiment shown, the insulating members 163 and 164 comprise portions of a structure which also extends beneath electrode member 161, isolating it from the source line. Other example structures may use different materials for the electrode members and insulating members.

Figure 13:
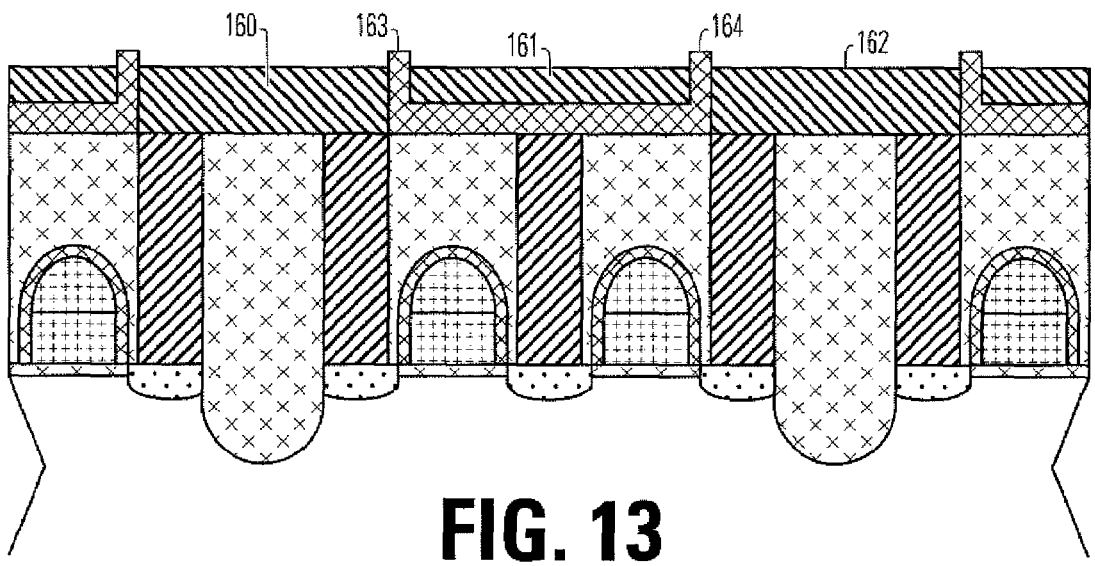
FIG. 13 shows a cross-sectional view corresponding to steps for etching back the conductive material to cause insulating walls formed by the sidewall insulators to protrude from the surface of the electrode layer.

FIG. 13 illustrates a next stage in the process, in which the electrode material of electrode members 160, 161, 162 is etched back slightly, revealing insulating walls 163, 164 extending 10 nm to 100 nm, for example, above the surfaces of the electrode members 160, 161, 162.

Figure 14:
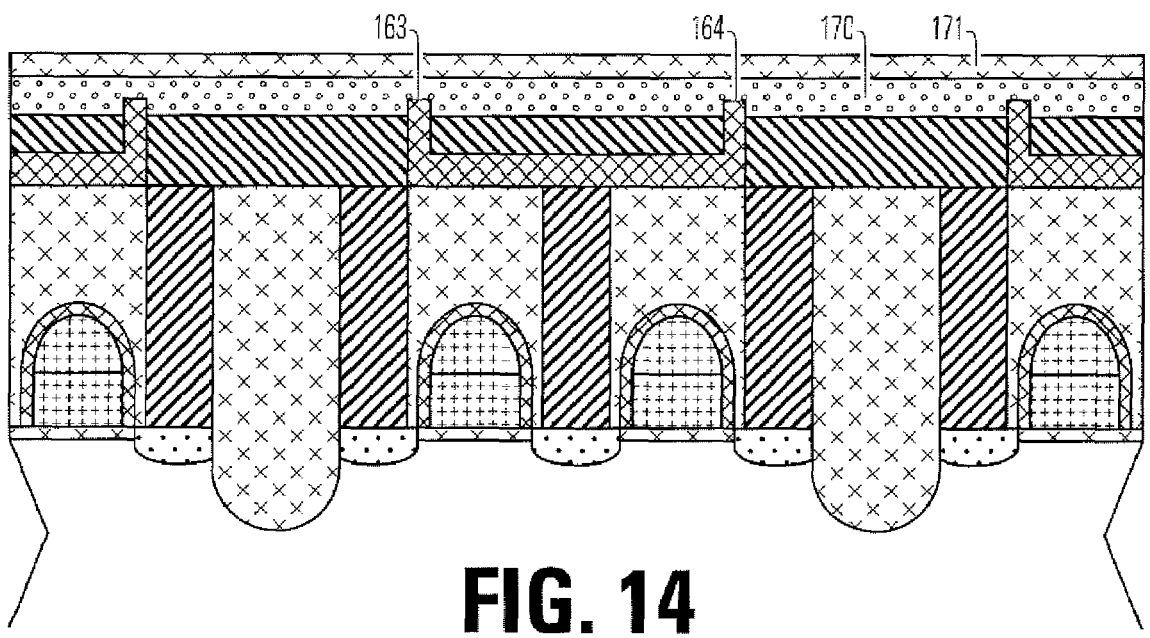
FIG. 14 shows a cross-sectional view corresponding to steps for forming a thin film layer of phase change material and a protective cap layer on the structure of FIG. 13.

FIG. 14 illustrates a next stage in the process, in which a thin film layer 170 of a phase change based memory material is formed on the substantially planar top surface of the electrode layer. The memory material is deposited using sputtering without collimation at about 250 degrees C. This results in a thin film having a thickness of about 60 nanometers or less on top of insulating walls 163, 164, when using $Ge_2Sb_2Te_5$ as the phase change memory material. Embodiments involve sputtering the entire wafer to thickness of about 40 nanometers on the flat surfaces. The thin film layer 170 has a thickness less than 100 nm in some embodiments, and more preferably 40 nm or less. In embodiments of the memory device, the thin film layer 170 has a thickness of less than 20 nm, such as 10 nm on top of insulating walls 163, 164. After forming the thin film layer 170, a protective cap layer 171 is formed. The protective cap layer 171 comprises a low-temperature deposited silicon dioxide or other dielectric material formed over the thin film layer 170. The protective cap layer 171 is preferably a good electrical insulator and a good thermal insulator, and protects the memory material from exposure in subsequent steps, such as photoresist stripping steps which can damage the material. The process involves formation of a low-temperature liner dielectric, such as a silicon nitride layer or silicon oxide layer, using a process temperature less than about 200 degrees C. One suitable process is to apply silicon dioxide using PECVD. After formation of the protective cap layer 171, a dielectric fill over the memory material can be implemented using a higher temperature process such as high-density plasma HDP CVD. In the illustrated embodiment, the material for the thermally insulating pads and for the narrow strip on the bridges of memory material is deposited in a single step. In alternative approaches, the material for the thermally insulating pads may be first deposited, followed by a step for planarizing the resulting structure, and then by a second deposition step for the material to be used on the narrow bridges.

Figure 15A:
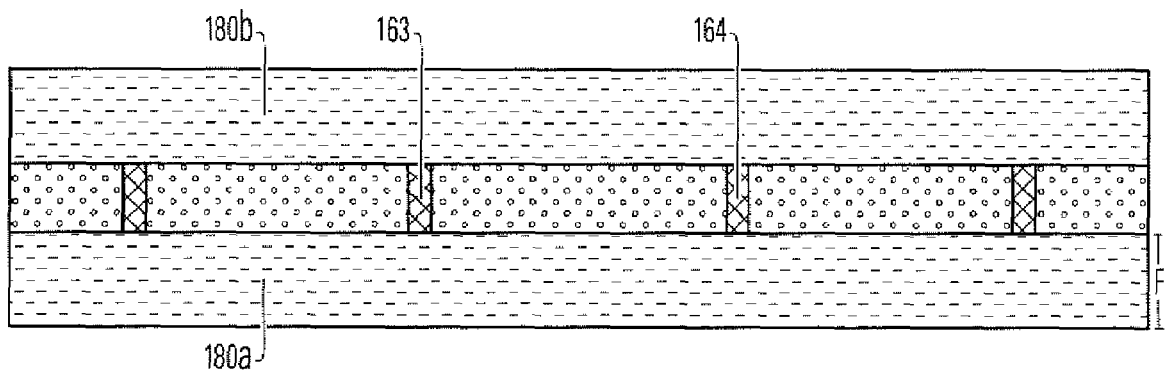
FIGS. 15A and 15B show layout and cross-sectional views for patterning the thin film layer of phase change material of FIG. 14, forming strips of photoresist on the phase change material.
Figure 15B:
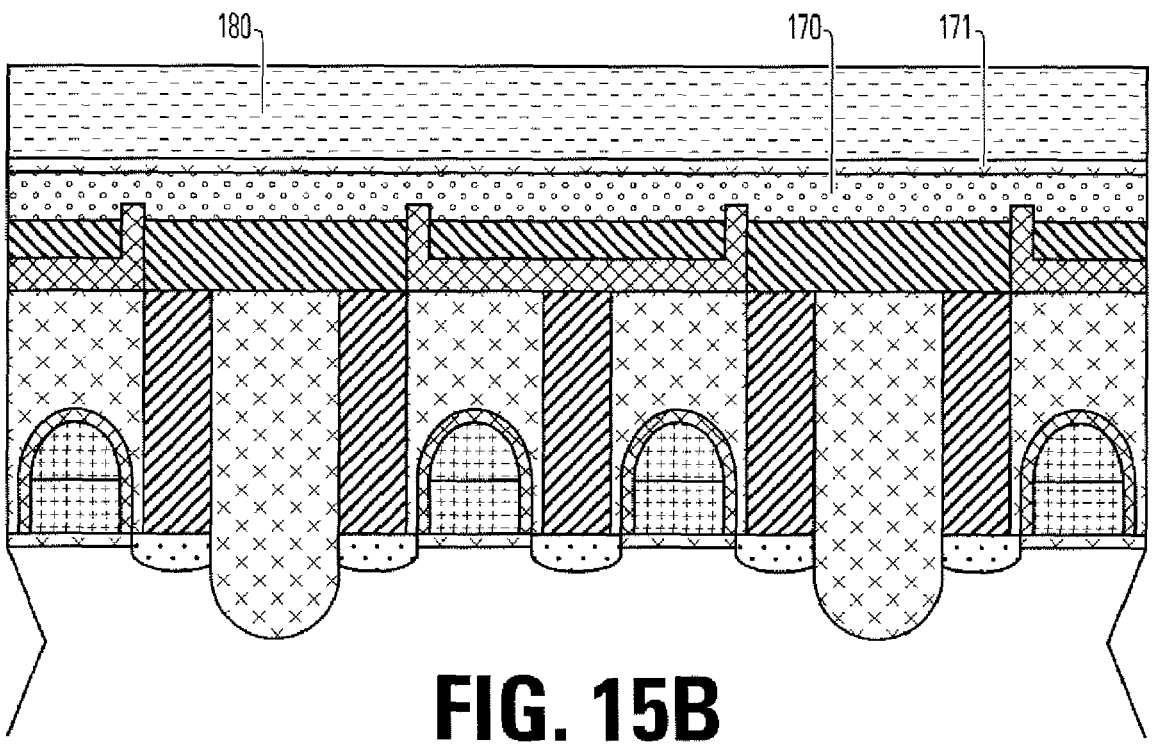
Figure 16A:
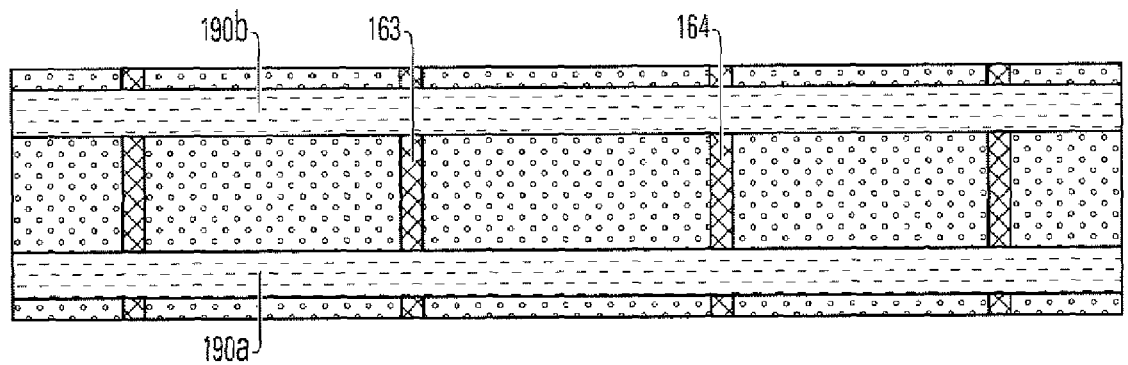
FIGS. 16A and 16B show layout and cross-sectional views for patterning the thin film layer of phase change material of FIG. 14, after etching the strips of photoresist of FIGS. 15A and 15B to form narrow strips of photoresist.

FIGS. 15A and 15B illustrate a next stage in the process, in which a photoresist layer 180 is formed and patterned in a mask lithographic process to define strips 180a, 180b over the thin film layer 170 and protective cap layer 171. As seen in FIG. 16A, the insulating members 163 and 164 are exposed between the strips 180a, 180b of photoresist. The strips of photoresist are made as narrow as possible according to the lithographic process applied. For example, the strips have a width equal to the minimum feature size F for the lithographic process used, where the minimum feature size for a process may be on the order of 0.2 microns (200 nm), 0.14 microns, or 0.09 microns in current mask lithographic processes. Obviously, embodiments of the process can be adapted to narrower minimum feature sizes as lithographic processes advance.

Figure 16B:
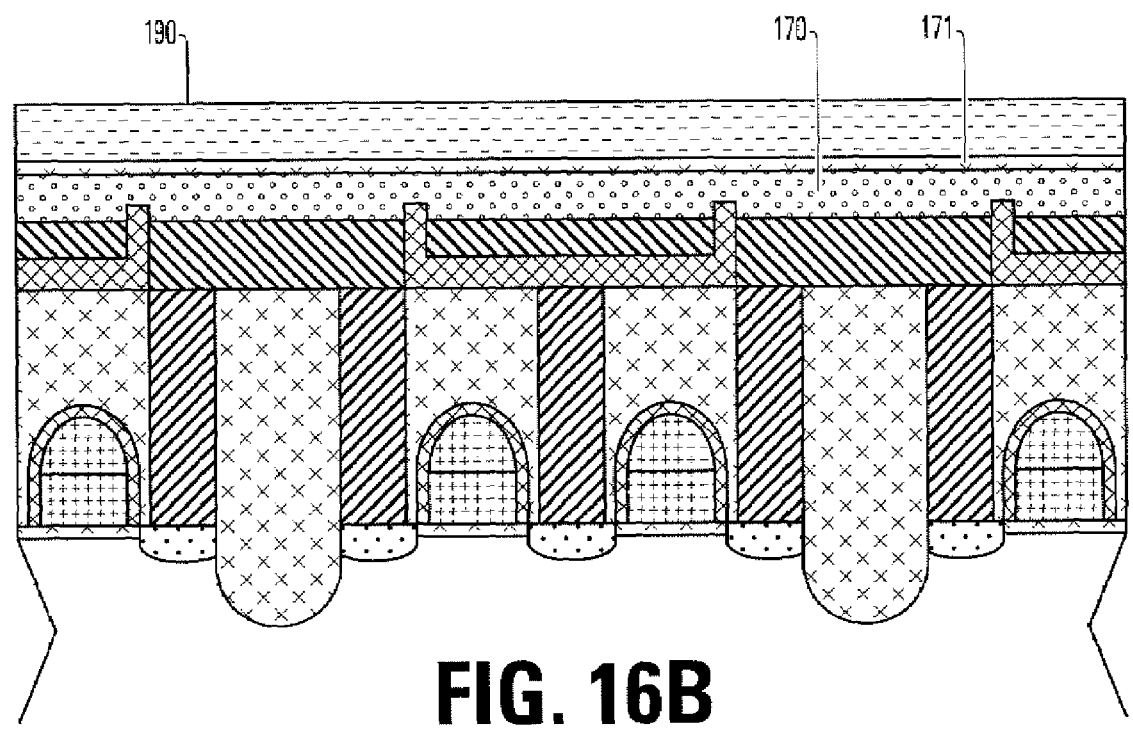

FIGS. 16A and 16B illustrate a next stage in the process, in which the photoresist strips 180a, 180b of FIG. 15A are trimmed to form more narrow photoresist strips 190a, 190b. As shown in FIG. 16B, the trimmed photoresist 190 is also thinner than the photoresist layer 180 of FIG. 15B. In one embodiment, the photoresist strips are trimmed by isotropic etching using a reactive ion etch process or otherwise. The etching trims the photoresist strips to more narrow line widths. Embodiments of the more narrow photoresist strips 190a, 190b are less than 100 nm wide. In other embodiments the more narrow photoresist strips 190a, 190b are about 40 nm or less wide. Photoresist trimming is applied using an oxide plasma to isotropically etch the photoresist, which trims its width and thickness down to a width of for example about 40 nanometers in a 0.09 micron (90 nanometer) minimum feature size lithographic process environment. In an alternative, a hard mask layer, such as a low temperature deposited layer of SiN or $SiO_2$ can be put on the bottom of the photoresist pattern to prevent etching damage of the memory material during the photoresist stripping process.

Figure 17A:
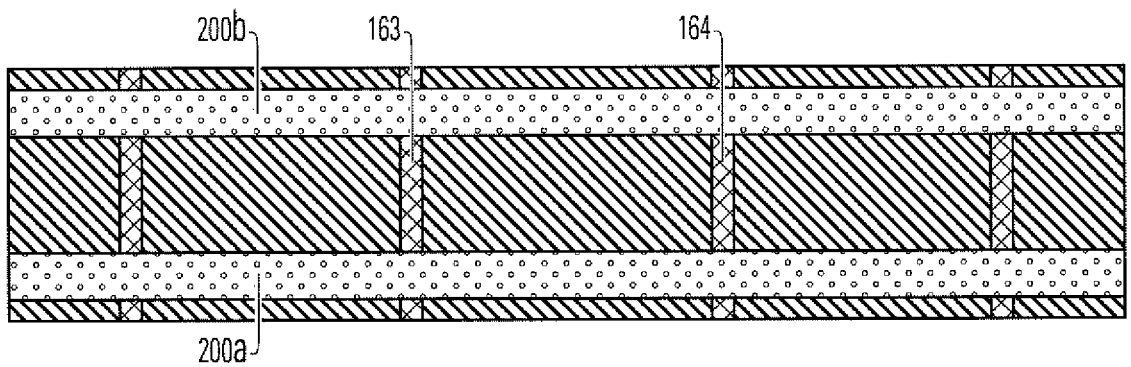
FIGS. 17A and 17B show layout and cross-sectional views of the strips of phase change material after etching the thin film layer of phase change material according to the pattern of photoresist shown in FIGS. 16A and 16B.
Figure 17B:
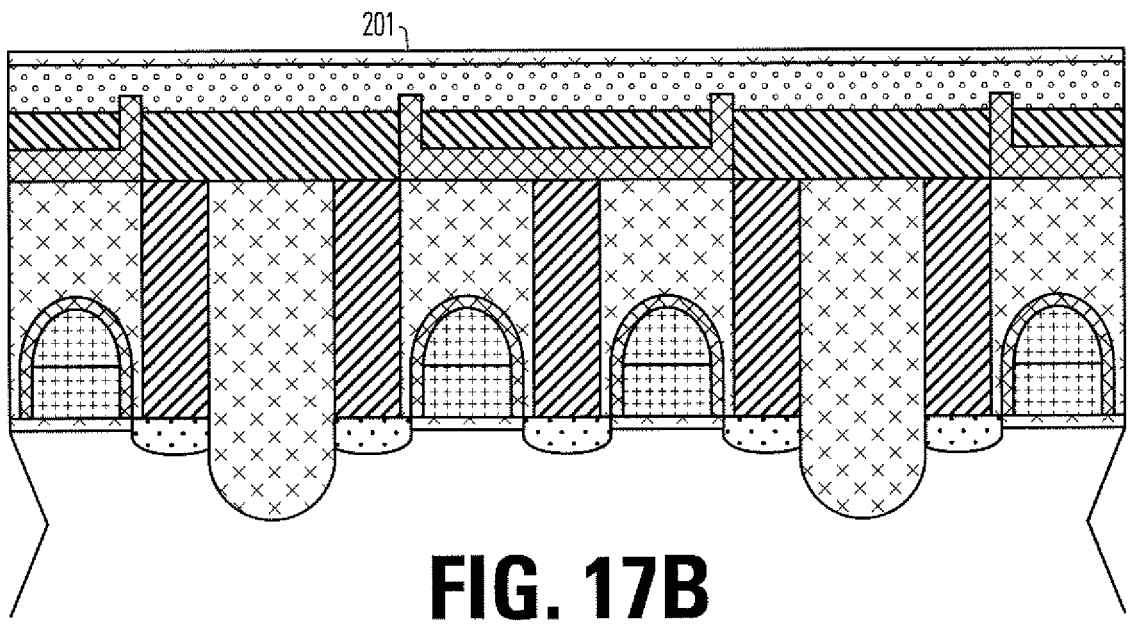

FIGS. 17A and 17B illustrate a next stage in the process, in which the more narrow photoresist strips 190a, 190b are used for an etch mask, and the thin film layer 200 of memory material is etched to lithographically define strips 200a, 200b of memory material, with or without the protective cap layer 201 including the pad and the strips of a memory cell as shown in FIG. 2. As shown, the strips 200a, 200b span across the insulating members 163, 164, and the electrode members in the electrode layer. In embodiments of the process the memory material comprises a GST chalcogenide based material, and is etched using for example, a chlorine-based or fluorine-based, reactive ion etching process.

Figure 18A:
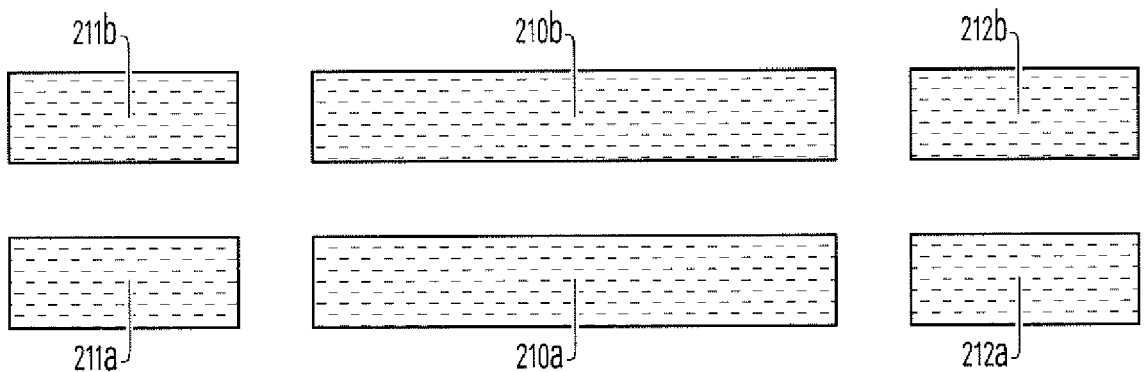
FIGS. 18A and 18B show layout and cross-sectional views for patterning the strips of phase change material of FIGS. 17A and 17B, used to form bridges of phase change material on the electrode layer.
Figure 18B:
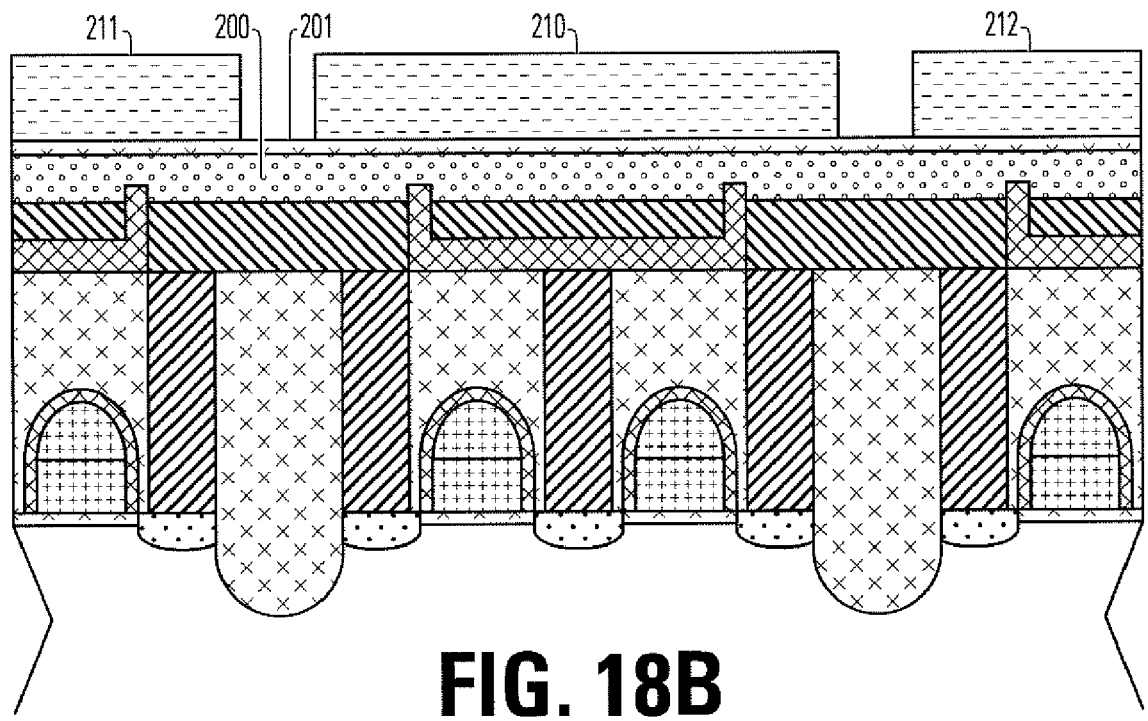

FIGS. 18A and 18B illustrate a next stage in the process, in which another photoresist layer 210, 211, 212 is formed and patterned to define photoresist structures 210a, 210b, 211a, 211b, 212a and 212b. The cell structures correspond with pairs of memory cells as described below. The cell structures are wider than the strips 200a, 200b shown in FIG. 17A of memory material because they have a width equal to the width achieved using the lithographic process applied in the manufacturing process, such as a photomask based lithographic process, without trimming. Thus, the width in some embodiments is equal to the minimum feature size F for the lithographic process applied in forming the layer.

Figure 19A:
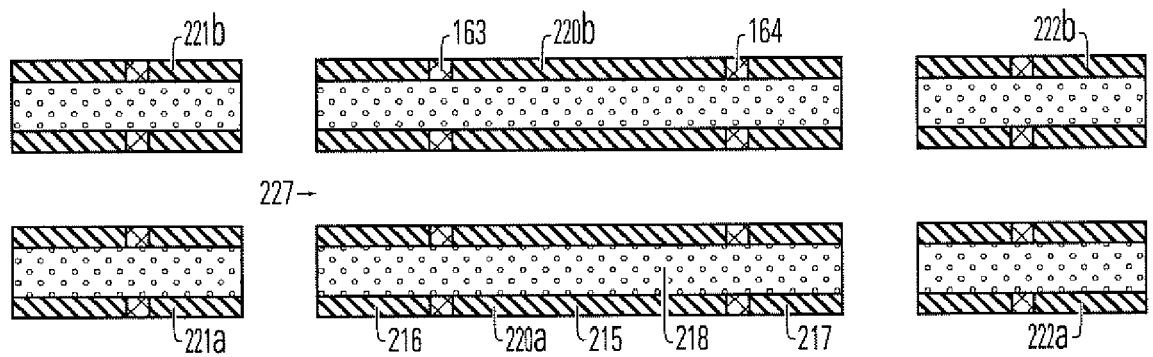
FIGS. 19A and 19B show layout and cross-sectional views of the bridges of phase change material after etching according to the pattern of FIGS. 18A and 18B.
Figure 19B:
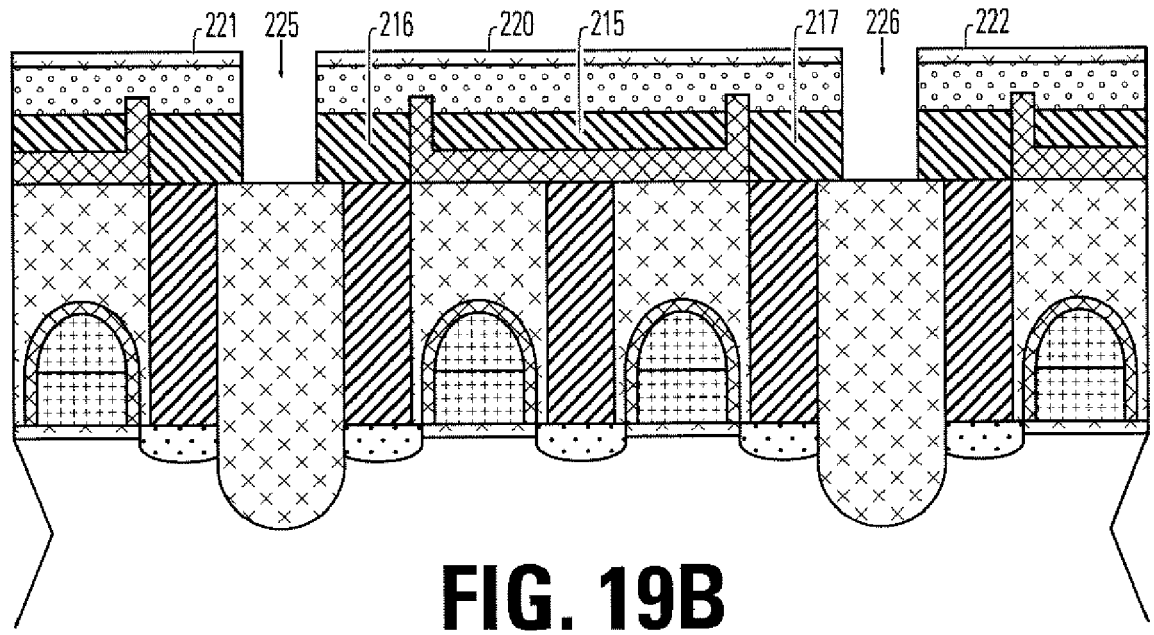

FIGS. 19A and 19B illustrate a next stage in the process, in which the photoresist structures 210a, 210b, 211a, 211b, 212a and 212b are used as etch masks to define cell structures (220a, 220b, 221a, 221b, 222a and 222b in FIG. 19A, 220, 221, 222, in FIG. 19B) by etching trenches 225, 226 to the isolation dielectric structures in the structure 99, and the trenches 227 between columns of cells orthogonal to the word lines. The cell structure 220a includes a first electrode member 215, a second electrode member 216 and a third electrode member 217. Insulating member 163 separates the first electrode member 215 from the second electrode member 216. Insulating member 164 separates the first electrode member 215 from the third electrode member 217. A bridge 218 of memory material (including thermally insulating pads and narrow strips as described with reference to FIG. 2) overlies the electrode members 215, 216 and 217 and the insulating members 163, 164 to establish two memory cells on the structure 220.

Figure 20:
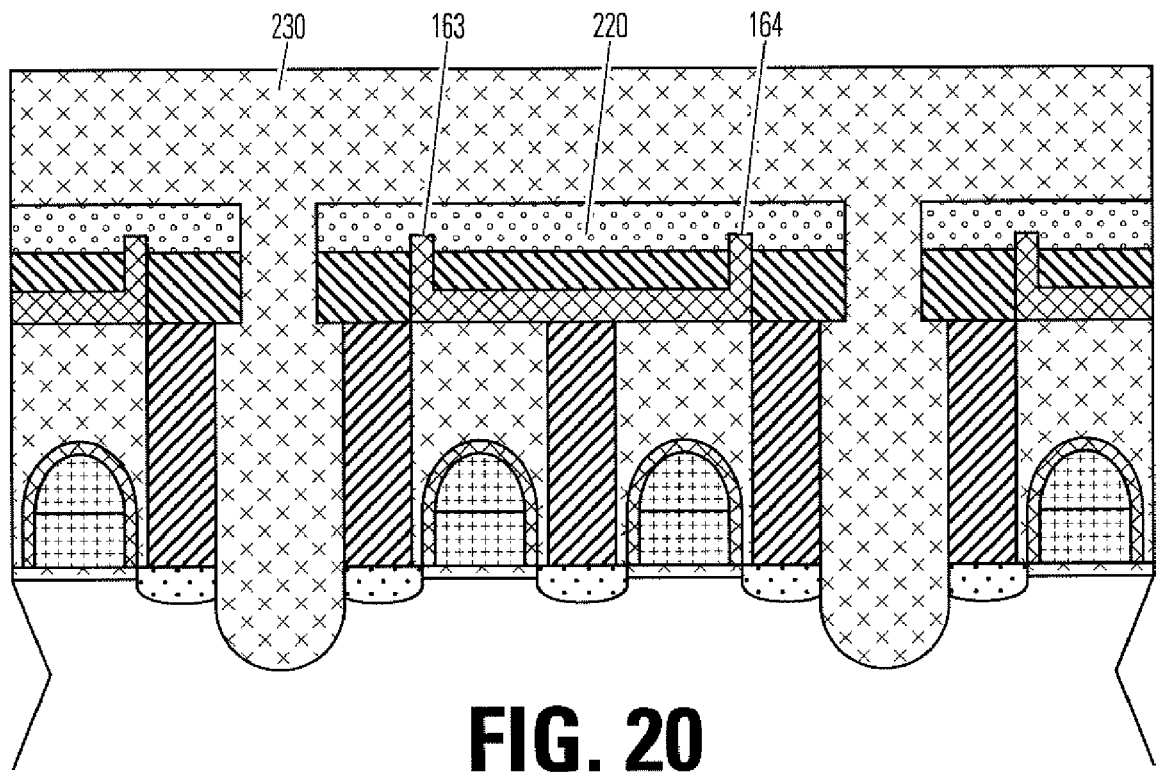
FIG. 20 shows a cross-sectional view corresponding to steps for forming a dielectric fill layer over the structure shown in FIGS. 19A and 19B, including the electrode layer and the bridges of phase change material.

FIG. 20 illustrates a next stage in the process, in which a dielectric fill layer 230 with a planar top surface is formed over the electrode structures and fills the gaps and trenches between them. In an embodiment of the process, the fill layer 230 is formed by high-density plasma HDP chemical vapor deposition CVD, followed by chemical mechanical polishing and cleaning. The dielectric fill may comprise silicon oxides, silicon nitrides, and other insulating materials, preferably having good thermal as well as electrical insulating properties.

In some embodiments a structure for thermally insulating the bridges is provided, in addition to or instead of the dielectric fill layer. In one example, the thermally insulating structure is formed by providing a cap layer of thermally insulating material over the bridges (218) and optionally over the electrode layer, before applying the dielectric fill. In one example, the thermally insulating structure is formed by providing a cap layer of thermally insulating material over the bridges (218) and optionally over the electrode layer, before applying the dielectric fill. Representative materials for the layer of thermally insulating material include materials that are a combination of the elements silicon Si, carbon C, oxygen O, fluorine F, and hydrogen H. Examples of thermally insulating materials which are candidates for use for the thermally insulating cap layer include $SiO_2$, SiCOH, polyimide, polyamide, and fluorocarbon polymers, selected so that the material has a lower thermal conductivity that the dielectric fill layer to be deposited over it. When the overlying material is SiO2, the thermally insulating material should have a thermal conductivity less than that of SiO2, or less than about 0.014 J/cm*degK*sec. In other preferred embodiments, the thermal insulator has a thermal conductivity less than that of the amorphous state of the phase change material, or less than about 0.003 J/cm*K*sec for a phase change material comprising GST. Many low-K materials, where low-K materials have permitivity less than that of $SiO_2$, are suitable thermal insulators. Examples of materials which are candidates for use for the thermally insulating cap layer include fluorinated SiO2, silsesquioxane, polyarylene ethers, parylene, fluoropolymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void in the dielectric fill formed over the bridge for thermal insulation. A single layer or combination of layers can provide thermal and electrical insulation.

Figure 21A:
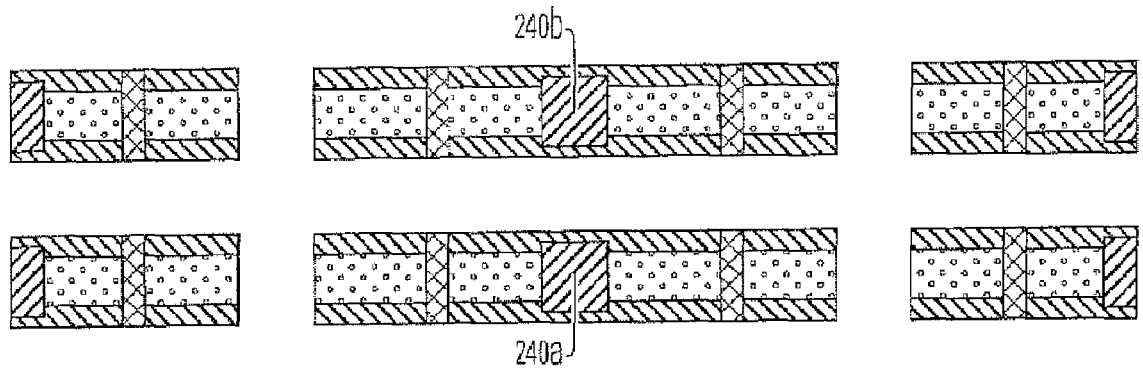
FIGS. 21A and 21B show layout and cross-sectional views after formation of conductive plugs in the dielectric fill layer contacting the electrode layer in the structure shown in FIG. 20.
Figure 21B:
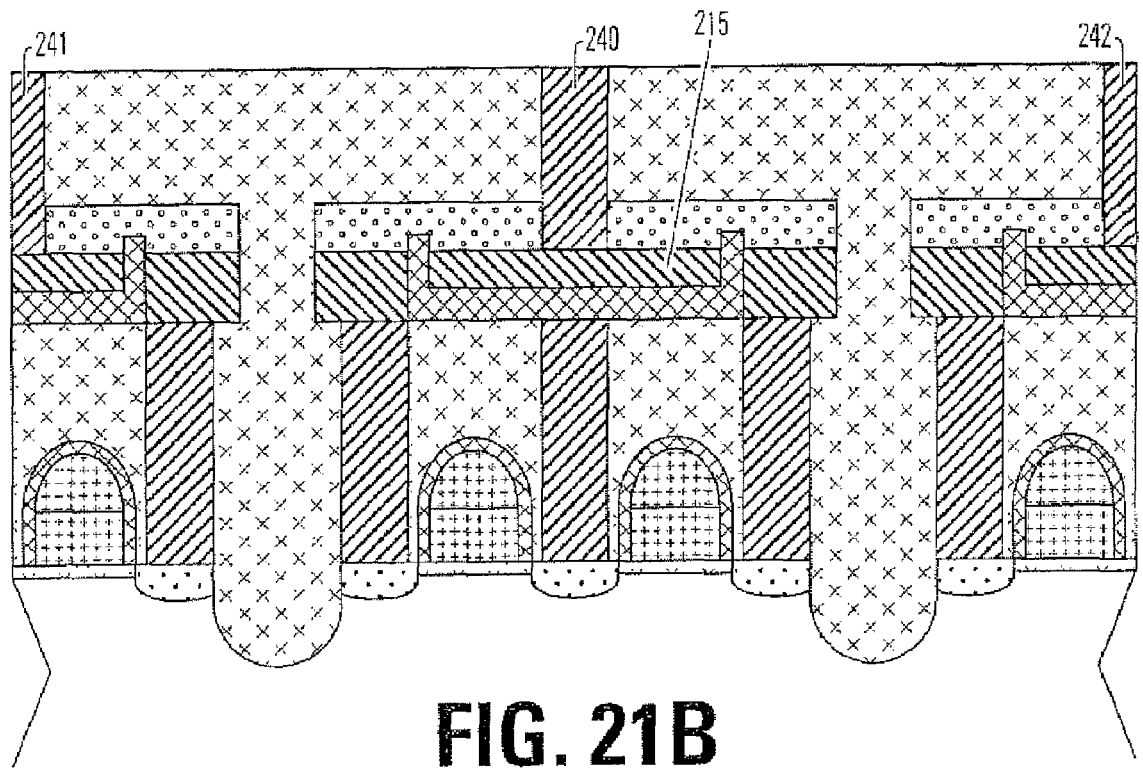

FIGS. 21A and 21B illustrate a next stage in the process, in which vias (not shown) are etched in the fill layer 230 to the electrode material, through the memory material and the fill. The via etch process may be a single anisotropic etch for both the fill and the memory material, or a two step process first etching the fill material with a first etch chemistry, and second etching the memory material with a second etch chemistry. After forming the vias, the vias are filled with tungsten or other conductive material, to form plugs 240 (240a, 240b in FIG. 21A), 241 and 242 contacting the first electrode member (e.g. member 215) in the electrode structures, for electrical communication with circuitry above the electrode layer. In embodiments of the process, the vias are lined with a diffusion barrier layer and/or an adhesion layer, as known in the art, and filled with tungsten or other suitable conductive material. The structure is then planarized by chemical mechanical polishing and cleaned. Finally a "clean up" etch is applied and the resulting structure is cleaned.

Figure 22:
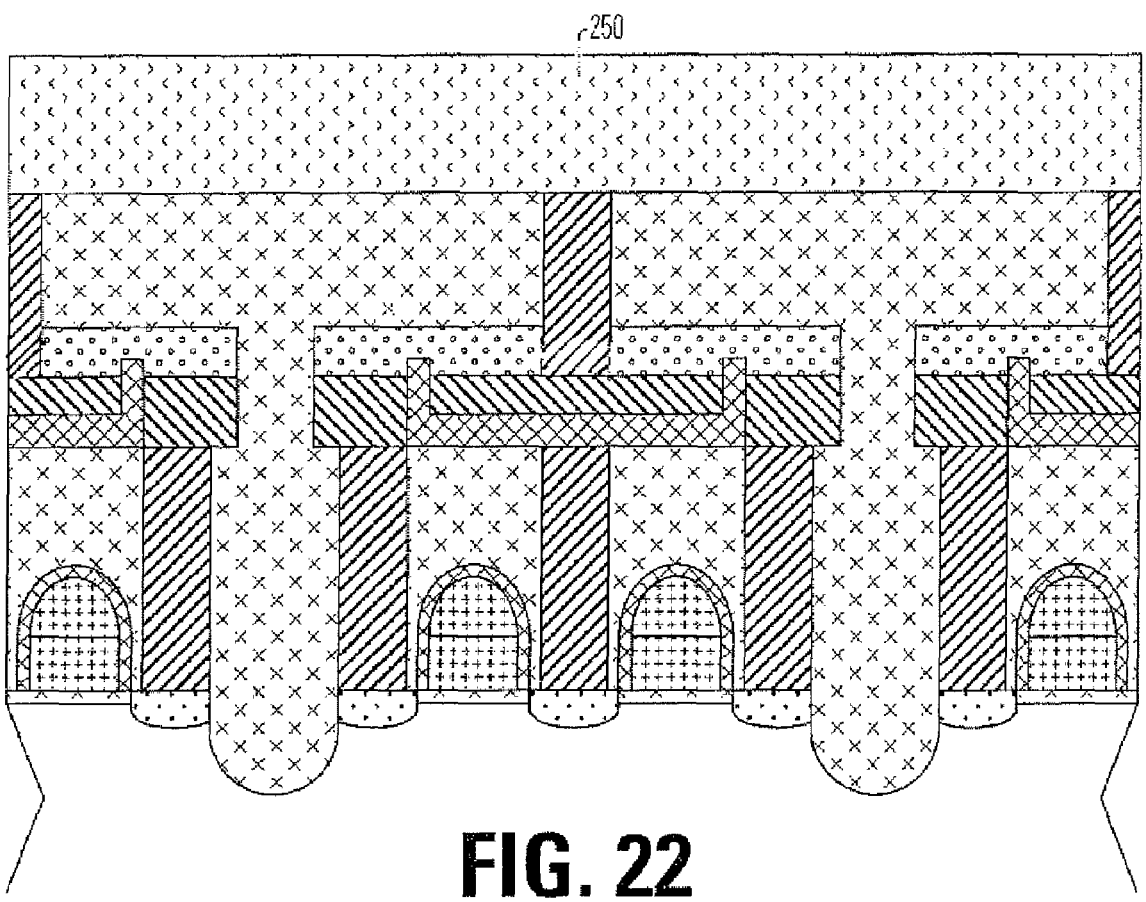
FIG. 22 shows a cross-sectional view corresponding to steps for forming a patterned conductive layer structure over the structure shown in FIGS. 21A and 21B.

FIG. 22 illustrates a next stage in the process, in which a patterned conductive layer 250 is formed in contact with the plugs over the fill layer, providing bit lines and other conductors for the memory device, yielding the structure shown and described above with respect to FIG. 3. In embodiments of the process, a copper alloy damascene metallization process is used in which the patterned conductive layer is formed depositing fluorosilicate glass (FSG) on the exposed surface, and then forming a photoresist pattern in the pattern desired. An etch is applied removing exposed FSG, and then liner and seed layers are deposited in the pattern. Then, copper plating is applied to fill the pattern. After plating, an anneal step is applied, followed by a polishing process. Other embodiments can use standard Al—Cu processes, or other metallization processes known in the art.

Other techniques for implementing a narrow bridge of memory material are shown in our prior U.S. patent application Ser. No. 11/155,067, entitled THIN FILM FUSE PHASE CHANGE RAM AND MANUFACTURING METHOD, filed 17 Jun. 2005, which is incorporated by reference as if fully set forth herein.

Most phase change memory cells known to applicant are made by forming a small pore filled with phase change material, and top and bottom electrodes contacting the phase change material. The small pore structure is used to reduce the programming current. This invention reduces programming current without formation of the small pore, resulting in better process control. Furthermore, there are no top electrodes on the cell, avoiding some possible damage of the phase change material from processes used to form the top electrode.

A cell described herein comprises two bottom electrodes with a dielectric spacer in between and a bridge of phase change material on the top of the electrodes spanning across the spacer. The bottom electrodes and dielectric spacer are formed in an electrode layer over front-end-of-line CMOS logic structures or other function circuit structures, providing a structure that easily support embedded memory and function circuits on a single chip, such as chips referred to as system-on-a-chip SOC devices.

Advantages of an embodiment described herein include that the phase change happens on the center of the bridge over the dielectric spacer, rather than on the interface with an electrode, providing better reliability. Also, the current used in reset and programming is confined in a small volume allowing high current density and resultant local heating at lower reset current levels and lower reset power levels. The structure in embodiments described herein allows two dimensions of the cell to be defined by thin film thickness, achieving better process control at nanometer scales. Only one dimension of cell can be defined by a lithographic process using a trimmed mask layer, which avoids more complex shrinking techniques.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

What is claimed is:

1. A memory device, comprising:
a substrate;
an electrode layer on the substrate, the electrode layer including an array of electrode pairs, an electrode pair in the array of electrode pairs having a first electrode having a top surface, a second electrode having a top surface, and an insulating member between the first electrode and the second electrode, the insulating member extending outwardly from the top surfaces of the first and second electrodes to define a wall of insulating material having a top side, and
an array of bridges, respective bridges in the array of bridges crossing the insulating member of a corresponding electrode pair in the array of electrode pairs, a bridge in the array of bridges comprising first and second thermally insulating pads contacting the top surfaces of the first and second electrodes of the corresponding electrode pair, and an active layer of memory material on the first and second thermally insulating pads and the top side of the wall of insulating material of the corresponding electrode pair, the memory material having at least two solid phases.

2. The device of claim 1, wherein said active layer of memory material comprises a thin film with a thickness about 50 nm or less and a width about 50 nm or less.

3. The device of claim 1, wherein said active layer of memory material comprises a thin film with a thickness about 20 nm or less and a width about 20 nm or less.

4. The device of claim 1, wherein said active layer of memory material comprises a thin film with a thickness about 10 nm or less and a width about 10 nm or less.

5. The device of claim 1, wherein the first and second thermally insulating pads of said bridge in the array of bridges comprise material having a thermal conductivity less than a thermal conductivity of the first and second electrodes of the corresponding electrode pair.

6. The device of claim 1, wherein the first and second thermally insulating pads of said bridge in the array of bridges comprise said memory material.

7. The device of claim 1, wherein the at least two solid phases include an amorphous phase and a crystalline phase.

8. The device of claim 1, wherein a thickness of the insulating member of said electrode pair in the array of electrode pairs is less than 100 nm.

9. The device of claim 1, wherein said active layer of memory material of said bridge in the array of bridges has a thickness on the top side of the wall of insulating material of the corresponding electrode pair less than 50 nm.

10. The device of claim 1, wherein the memory material comprises an alloy including a combination of Ge, Sb, and Te.

11. The device of claim 1, wherein the memory material comprises an alloy including a combination of two or more materials from a group consisting of Ge, Sb, Te, Se, In, Ti, Ga, Bi, Sn, Cu, Pd, Pb, Ag, S, and Au.

12. The device of claim 1, wherein the first and second thermally insulating pads of said bridge in the array of bridges are thicker than said active layer of memory material over the wall of insulating material of the corresponding electrode pair.

13. The device of claim 1, wherein the first and second thermally insulating pads of said bridge in the array of bridges have respective top surfaces coplanar with the top side of the wall of insulating material of the corresponding electrode pair.

14. The device of claim 1, wherein the first and second thermally insulating pads of said bridge in the array of bridges have respective widths greater than that of the layer of memory material.

* * * * *

UNITED STATES PATENT AND TRADEMARK OFFICE
CERTIFICATE OF CORRECTION

| | | |
|---|---|---|
| PATENT NO. | : 7,642,539 B2 | Page 1 of 1 |
| APPLICATION NO. | : 11/425183 | |
| DATED | : January 5, 2010 | |
| INVENTOR(S) | : Hsiang Lan Lung | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 576 days.

Signed and Sealed this

Sixteenth Day of November, 2010

David J. Kappos
*Director of the United States Patent and Trademark Office*